United States Patent
Muramatsu et al.

(10) Patent No.: US 11,823,897 B2
(45) Date of Patent: Nov. 21, 2023

(54) METHOD FOR FORMING INSULATING FILM, APPARATUS FOR PROCESSING SUBSTRATE, AND SYSTEM FOR PROCESSING SUBSTRATE

(71) Applicant: TOKYO ELECTRON LIMITED, Tokyo (JP)

(72) Inventors: Makoto Muramatsu, Koshi (JP); Hisashi Genjima, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/697,311

(22) Filed: Mar. 17, 2022

(65) Prior Publication Data
US 2022/0208547 A1 Jun. 30, 2022

Related U.S. Application Data

(62) Division of application No. 16/645,712, filed as application No. PCT/JP2018/031810 on Aug. 28, 2018, now Pat. No. 11,315,784.

(30) Foreign Application Priority Data

Sep. 11, 2017 (JP) .................... 2017-174287

(51) Int. Cl.
*C23C 18/14* (2006.01)
*H01L 21/02* (2006.01)

(52) U.S. Cl.
CPC ...... *H01L 21/02348* (2013.01); *C23C 18/143* (2019.05); *H01L 21/0214* (2013.01);
(Continued)

(58) Field of Classification Search
CPC .......................................... H01L 21/67–68792
See application file for complete search history.

(56) References Cited

U.S. PATENT DOCUMENTS

| | | | | |
|---|---|---|---|---|
| 2004/0052624 A1* | 3/2004 | Miyano | ............ | H01L 21/67265 414/940 |
| 2009/0053904 A1* | 2/2009 | You | .................. | H01L 21/02337 700/121 |

(Continued)

FOREIGN PATENT DOCUMENTS

| | | |
|---|---|---|
| JP | H7-99237 A | 4/1995 |
| JP | 2006-100299 A | 4/2006 |

(Continued)

*Primary Examiner* — Erik Kielin
(74) *Attorney, Agent, or Firm* — Nath, Goldberg & Meyer; Jerald L. Meyer; Tanya E. Harkins

(57) ABSTRACT

There is provided a technique of forming an insulating film containing silicon oxide. A coating solution containing polysilazane is applied onto a wafer W, the solvent of the coating solution is volatilized, and the coating film is irradiated with ultraviolet rays in nitrogen atmosphere before performing a curing process. Dangling bonds are generated in silicon which is a pre-hydrolyzed site in polysilazane. Therefore, the energy for hydrolysis is reduced, and unhydrolyzed sites are reduced even when the temperature of the curing process is 350° C. Since efficient dehydration condensation occurs, the crosslinking rate is improved, and a dense (good-quality) insulation film is formed. By forming a protective film on the surface of the coating film to which ultraviolet rays irradiated, the reaction of dangling bonds prior to the curing process is suppressed.

7 Claims, 22 Drawing Sheets

(52) U.S. Cl.
CPC .. *H01L 21/02164* (2013.01); *H01L 21/02222* (2013.01); *H01L 21/02282* (2013.01); *H01L 21/02323* (2013.01); *H01L 21/02326* (2013.01)

(56) References Cited

U.S. PATENT DOCUMENTS

| | | |
|---|---|---|
| 2014/0234602 A1 | 8/2014 | Cros et al. |
| 2015/0344651 A1 | 12/2015 | Kondo |
| 2016/0108282 A1 | 4/2016 | Ito |
| 2016/0336542 A1* | 11/2016 | Chen .................. H10K 50/8445 |
| 2019/0371602 A1 | 12/2019 | Kuo et al. |

FOREIGN PATENT DOCUMENTS

| | | |
|---|---|---|
| JP | 2010-3983 A | 1/2010 |
| JP | 2010-80709 A | 4/2010 |
| JP | 2012-174717 A | 9/2012 |
| JP | 2012-174764 A | 9/2012 |

* cited by examiner

FIG. 9
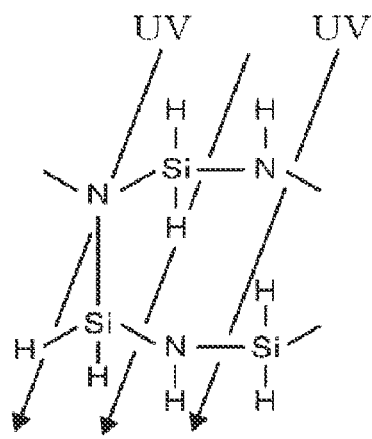
FORMATION OF DANGLING BOND
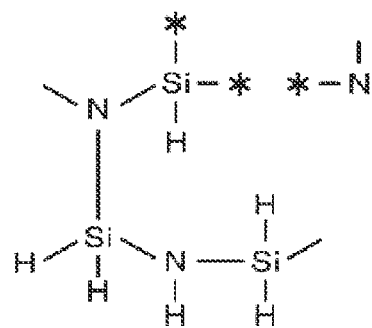
FORMATION OF HYDROXYL GROUP
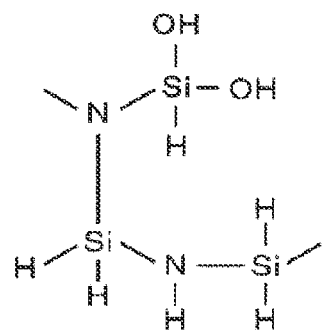

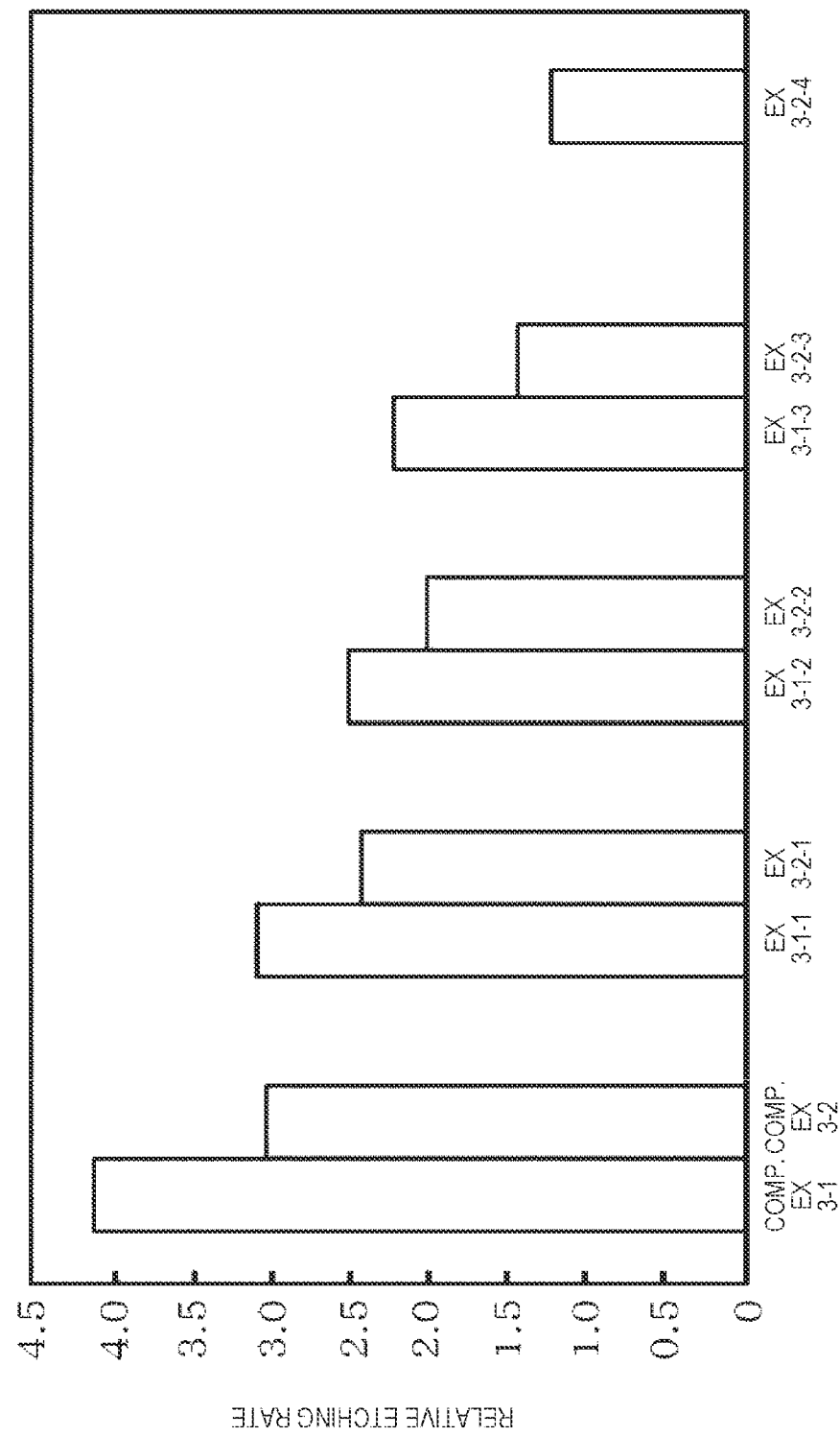

METHOD FOR FORMING INSULATING FILM, APPARATUS FOR PROCESSING SUBSTRATE, AND SYSTEM FOR PROCESSING SUBSTRATE

This is a Divisional Application of U.S. patent application Ser. No. 16/645,712, filed Mar. 9, 2020, an application filed as a national stage under 371 of Application No. PCT/JP2018/031810 filed Aug. 28, 2018 and claiming benefit from Japanese Application No. 2017-174287, filed Sep. 11, 2017, the content of each of which is hereby incorporated by reference in its entirety.

TECHNICAL FIELD

The present disclosure relates to a technology of forming an insulating film that is a silicon oxide-containing coated film and is hardened by a cross-linking reaction.

BACKGROUND

There is a process of forming an insulating film such as a silicon oxide film in the processes of manufacturing semiconductor devices. The insulating film is formed, for example, by plasma CVD or by applying a coating liquid. An insulating film formed by plasma CVD has an advantage that a high quality film is obtained because it is dense, but embeddability is poor. Accordingly, for example, the insulating film is not suitable when an insulator is embedded in a fine groove called a Shallow Trench Isolation (STI). Accordingly, for example, it is required to gradually embed the insulating film such that a gap is not generated, by repeating plasma CVD and etch-back, so the process of forming a film is complicated or a large-scale apparatus is required to perform vacuum processing.

Further, according to a method of forming an insulating film by applying a coating liquid to a semiconductor wafer (hereafter, referred to as a 'wafer') through spin coating, etc., and then curing the coated film, embeddability is good, so it is easy to fill even fine patterns such as an STI with an insulating film. Further, there is an advantage that processing can be performed in an ordinary pressure atmosphere, but there is problem that the strength of the film is relatively low. Accordingly, the strength of the film is increased, for example, by performing a heat treatment (curing) on a coated film at 600 to 800 degrees C.

However, according to a miniaturization of the pattern, there is a request for suppressing a thermal history for a semiconductor device to be manufactured as low as possible. Therefore, for example, when an interlayer insulating film is formed, the temperature cannot be increased over 400 degrees C. in light of migration of copper (Cu) wires, diffusion of Cu, etc. Therefore, the method of forming an insulating film by applying a coating liquid cannot be applied to an interlayer insulating film due to the high curing temperature.

A technology of forming an insulating film by forming a coated film, heating the coated film at a low temperature, and then processing the coated film at a high temperature in a water vapor atmosphere is described in Patent Document 1, but it does not solve the problems solved by the technology of the present disclosure.

PRIOR ART DOCUMENTS

Patent Documents

Patent Document 1: Japanese Laid-Open Patent Publication No. 2012-174717.

SUMMARY

The purpose of the present disclosure is to provide a technology that achieves a good quality of a film when forming an insulating film containing a silicon oxide as a coated film on a substrate.

According to one embodiment of the present disclosure, there is provided a method for a method of forming an insulating film, the method including: a process of forming a coated film on a substrate by applying a coating liquid, which is obtained by dissolving a precursor for forming an insulating film containing silicon oxide in a solvent, to the substrate; a solution volatilization process of volatilizing the solvent in the coated film; subsequently, an energy supply process of supplying energy to the coated film in a low-oxygen atmosphere having a concentration of oxygen lower than an atmospheric atmosphere to form dangling bonds at molecular groups constituting the precursor; a process of forming, on a surface of the coated film, a protective film for suppressing oxidation of the dangling bonds in the coated film due to the atmospheric atmosphere; and subsequently, a curing process of forming the insulating film by heating the substrate and crosslinking the precursor.

According to another embodiment of the present disclosure, there is provided an apparatus for processing a substrate, including: a coating module configured to form a coated film on a substrate by applying a coating liquid, which is obtained by dissolving a precursor for forming an insulating film containing silicon oxide in a solvent, to the substrate; a solvent volatilization module configured to volatilize the solvent in the coated film; an energy supply module configured to supply energy to the coated film in which the solvent has been volatilized, in a low-oxygen atmosphere having a concentration of oxygen lower than an atmospheric atmosphere so as to activate the precursor; a protective film formation module configured to form a protective film on the coated film to which the energy has been supplied; and a substrate transfer mechanism configured to transfer the substrate between the respective modules.

According to yet another embodiment of the present disclosure, there is provided a system for processing a substrate, including: an apparatus for processing a substrate which includes: a load/unload port configured to load/unload the substrate accommodated in a transfer container; a coating module configured to form a coated film on the substrate by applying a coating liquid, which is obtained by dissolving a precursor for forming an insulating film containing silicon oxide in a solvent, to the substrate; a solvent volatilization module configured to volatilize the solvent in the coated film; an energy supply module configured to supply energy to the coated film in which the solvent has been volatilized, in a low-oxygen atmosphere having a concentration of oxygen lower than an atmospheric atmosphere so as to activate the precursor; a protective film formation module configured to form a protective film on the coated film to which the energy has been supplied; and a substrate transfer mechanism configured to transfer the substrate between the respective modules and the load/unload port; a heat treatment apparatus configured to form the insulating film by heating the substrate processed in the apparatus for processing the substrate and crosslinking the precursor; and a container transfer mechanism configured to transfer the transfer container between the load/unload port of the apparatus for processing the substrate and the curing apparatus.

According to the present disclosure, a coating liquid containing a precursor of an insulating film containing a silicon oxide is applied to a substrate, a solvent in the coating liquid is volatilized, and energy is supplied to the coated film in a low-oxygen atmosphere before a curing process is performed. Accordingly, dangling bonds are easily produced at portions that are hydrolyzed in the precursor. In the curing process, hydroxyl groups are bonded to silicon at molecular groups constituting the precursor by hydrolysis at first, and then crosslinking is performed by dehydration condensation of the hydroxyl groups at the molecular groups. However, by forming dangling bonds in advance at silicon that is the portions that are hydrolyzed, production efficiency of the hydroxyl groups is increased. That is, since the energy for hydrolysis decreases, the portions remaining without hydrolyzing decreases even if the curing process is performed at a low temperature. As a result, dehydration condensation efficiently occurs, so a crosslinking rate is improved and it is possible to form a dense (good-quality) insulating film.

Further, it is possible to suppress reaction of dangling bonds before the curing process by forming a protective film on the surface of a coated film after supplying energy to the coated film, whereby the quality of the coated film is improved.

BRIEF DESCRIPTION OF DRAWINGS

FIG. 9 is a diagram illustrating a reaction path of polysilazane in a film-forming processing of the present disclosure.

FIG. 27 is a characteristic diagram showing a relative etching rate in Example 3.

DETAILED DESCRIPTION

[Summary of Disclosure]

The contents of the present disclosure are described before embodiments of the present disclosure are described. As an example of a method of forming an insulating film of the present disclosure, there may be a process of applying a coating liquid containing a precursor of an insulating film containing a silicon oxide to a substrate, volatilizing a solvent in the obtained coated film by heating the coated film, subsequently, rearranging the molecular groups in the coated film by heating the substrate, after that, radiating ultraviolet rays to the coated film, and then curing the coated film.

Figure 1:
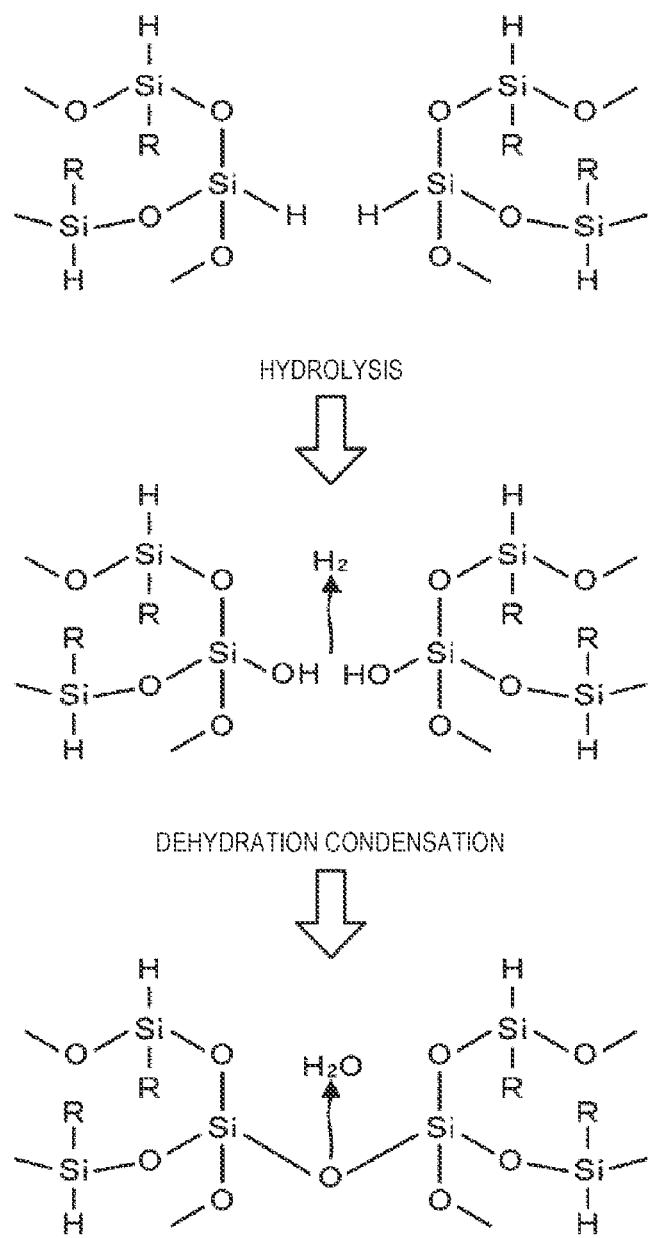
FIG. 1 is a diagram illustrating a general curing process for an insulating film.

The coating liquid is produced by dissolving groups of oligomer that are molecular groups of the precursor of the insulating film containing a silicon oxide into a solution that is a solvent. In a general curing process, Si—OH is produced by hydrolysis (reaction) between $H_2O$ (water) and Si—H bonds of oligomer, as shown in FIG. 1, by heating a substrate at 500 degrees C., for example. Further, dehydration condensation (reaction) occurs, whereby Si—O—Si bonds are produced and oligomers are cross-linked.

The reason that oligomer is used as a component of the coating liquid is because when all of precursor is connected, it is not solved in a solution. For these reasons, the state of oligomer, that is, the state of the precursor before the hydrolysis described above is stable and the hydrolysis is a process that changes the stable state into an unstable state, so it is difficult to promote hydrolysis. Accordingly, it is required to increase the temperature for curing or induce reaction for a long time at a low temperature.

Meanwhile, the dehydration condensation (reaction) quickly progresses just by giving thermal energy. For these reasons, when the temperature for curing is increased to promote hydrolysis, dehydration condensation (in which Si—OH becomes Si—O—Si) easily occurs rather than hydrolysis (in which Si—H becomes Si—OH), so denseness of an insulating film is low. It is generally presumed that the reason is because when some oligomers are cross-linked by dehydration condensation, other oligomers have not been hydrolyzed yet and are introduced into the crosslinking substances of the some oligomers. Further, according to the method of performing curing for long time at a low temperature, the throughput is low, so the method is difficult to be used in a production line.

Figure 2:
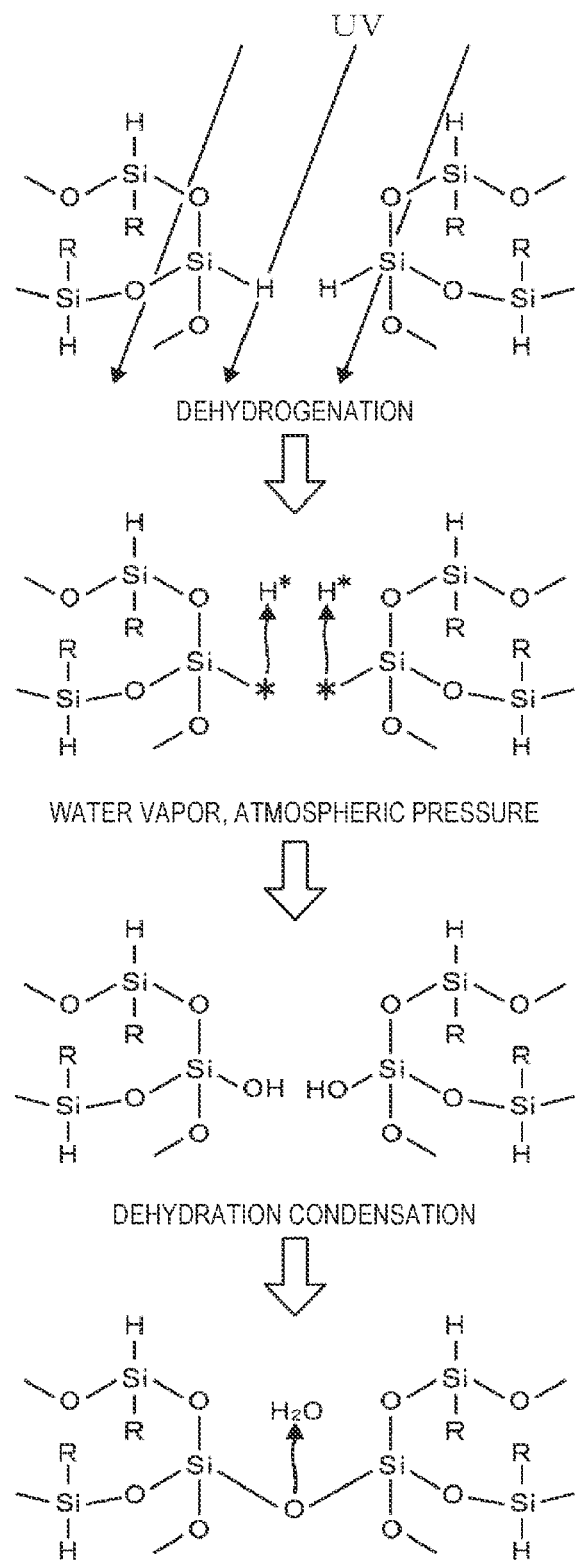
FIG. 2 is a diagram illustrating a curing process for an insulating film of the present disclosure.

Accordingly, in the present disclosure, for example, ultraviolet rays are radiated to a coated film before a curing process is performed so that dangling bonds are produced (oligomers are so-called activated) at parts where hydrolysis occurs. That is, as shown in FIG. 2, dangling bonds are produced by cutting Si—H bonds in oligomer using the energy of the ultraviolet rays. For these reasons, the energy necessary for hydrolysis in the curing process decreases, so the production efficiency of hydroxyl groups (OH-groups) increases and a crosslinking rate by the following dehydration condensation is improved. This means that a dense insulating film (having a good film quality) is obtained even if a curing process is performed at a low temperature.

It is required to radiate the ultraviolet rays to the coated film before performing the curing process. The reason is that even though the curing process is performed at a low temperature, it is performed in a heating atmosphere of, for example, 350 to 450 degrees C. For these reasons, when dangling bonds are produced by the energy of the ultraviolet rays, as described above, crosslinking occurs from the portion where dangling bonds have been generated, and thus, oligomers in which Si—H bonds have not yet been cut are locked in cross-linked oligomer groups. Therefore, denseness of an insulating film decreases.

Accordingly, it is necessary to perform the process of radiating the ultraviolet rays to the coated film at a temperature at which this phenomenon is suppressed. Specifically, for example, a temperature under 350 degrees C. is considered as being preferable. For example, the process may be performed at a room temperature. Further, the process of radiating the ultraviolet rays to the coated film needs to be performed in a low-oxygen concentration atmosphere having an oxygen concentration lower than an atmospheric atmosphere. Thus, the process is performed, for example, in an atmosphere with oxygen concentration of 400 ppm or less, preferably, 50 ppm or less. The low-oxygen concentration atmosphere may be, for example, an inert gas atmosphere such as nitrogen gas.

When the oxygen concentration is high in the atmosphere in which the process is performed, oligomers having dangling bonds produced by radiated the ultraviolet rays instantaneously bond to each other, and isolated oligomers are locked in the bonded oligomers, which results in decreased denseness of an insulating film.

After the process of radiating the ultraviolet rays to the coated film, for example, while the substrate is transferred from the substrate processing apparatus that has radiated the ultraviolet rays to the substrate to a heat treatment furnace for a curing treatment, the substrate may stand for a period (be left for a period) in a room-temperature atmospheric atmosphere in a state in which, for example, the substrate is stored in a receiving container. When dangling bonds are produced on the surface of the coated film by radiating the ultraviolet rays to the coated film, since the reactivity of the coated film is high, the dangling bonds are easily oxidized by oxygen or water in the atmosphere. However, when dangling bonds are oxidized at a low temperature, for example, in a range of room temperature, an oxide film having a low strength is formed, and thus the quality of the film is deteriorated. Accordingly, in the present disclosure, a protective film for suppressing an oxidation of a coated film is formed on the surface of the coated film before the substrate is taken out of the apparatus for processing a substrate. As the protective film, as described below, for example, an organic film, such as a dense oxide film, may be used.

First Embodiment

Figure 3:
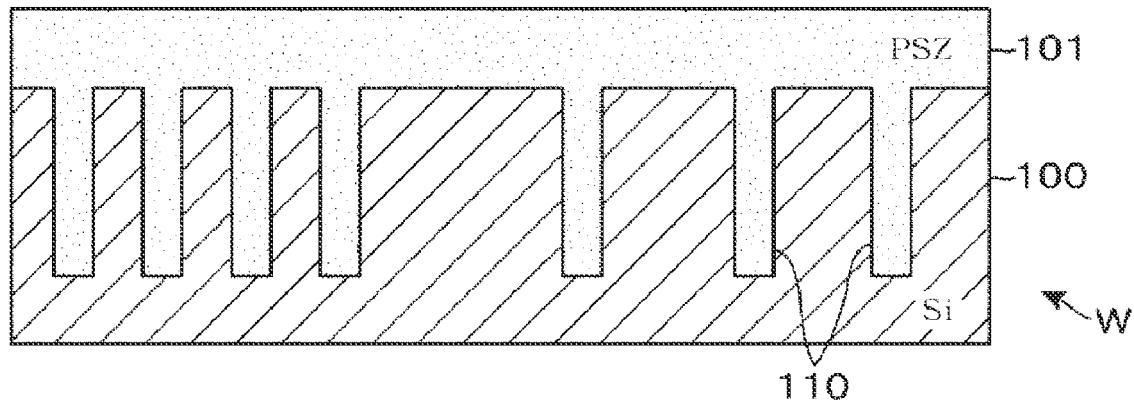
FIG. 3 is a diagram illustrating a process of forming an insulating film according to an embodiment of the present disclosure.

Next, an embodiment of a method of forming an insulating film of the present disclosure is described in detail. As a method of forming an insulating film using the system for processing a substrate, a process of performing STI on a target substrate is described. As shown in FIG. 3, grooves 110 (trenches) are formed in a silicon film 100 of a wafer W that is a target substrate. A coating liquid obtained, for example, by dissolving a precursor of SOG film in an organic solution is applied to the wafer W, whereby a coated film 101 is formed to fill the trenches 110. For example, polysilazane that is a polymer having —(SiH$_2$)NH— as a fundamental structure is used as the precursor. In the coating liquid, for example, molecular groups of polysilazane are dissolved in an oligomer state to improve fluidity. Accordingly, as shown in FIG. 3, when a coating liquid is applied to the wafer W, for example, by spin coating, the coating liquid easily enters the narrow trenches 110, so that the coated film 101 having a good embedding ability is obtained. Further, the coated film 101 is indicated as PSZ (polysilazane) in FIGS. 3 to 10.

Figure 4:
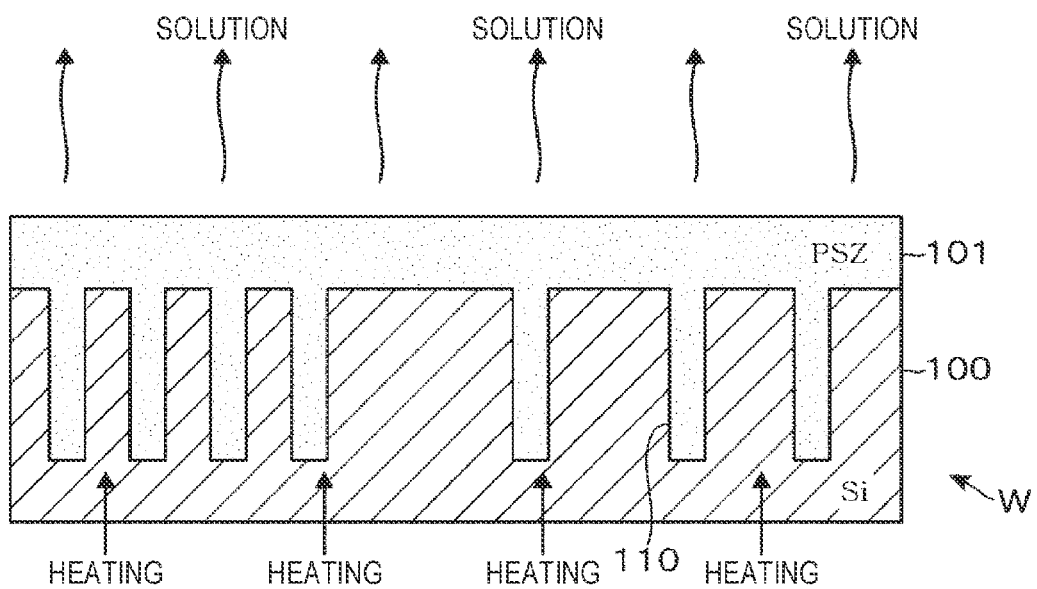
FIG. 4 is a diagram illustrating a process of forming an insulating film according to an embodiment of the present disclosure.
Figure 5:
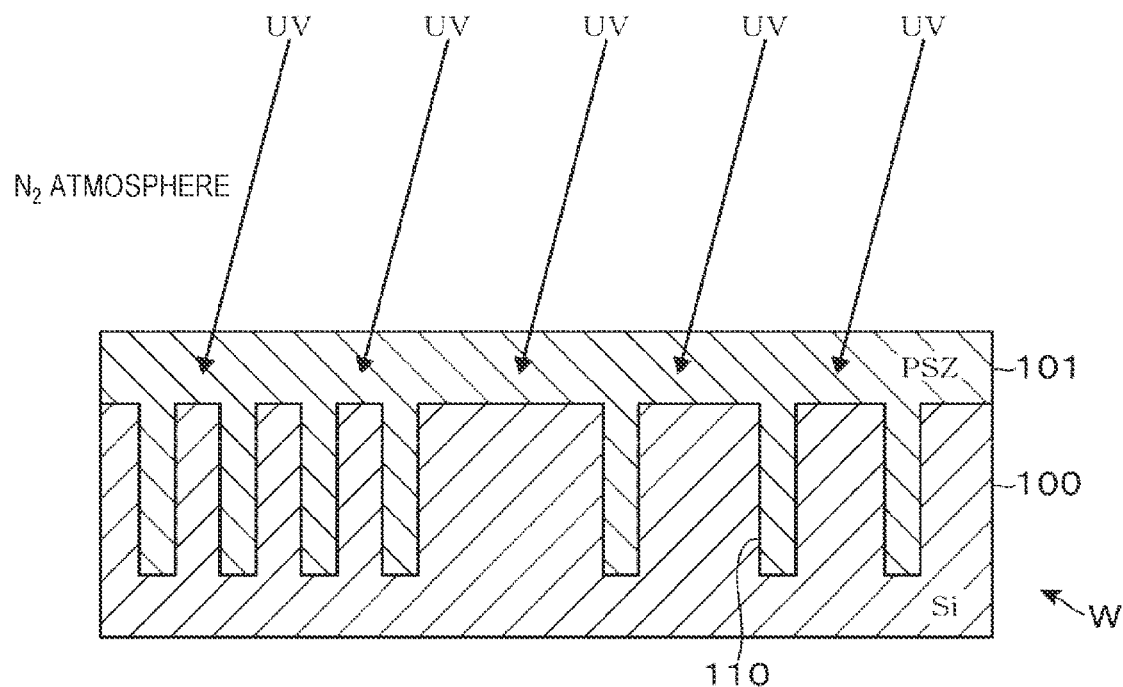
FIG. 5 is a diagram illustrating a process of forming an insulating film according to an embodiment of the present disclosure.

Next, as shown in FIG. 4, the wafer W is heated at 100 to 250 degrees C., for example, 150 degrees C., for 3 minutes. Accordingly, the solvent contained in the coated film 101 volatilizes. Thereafter, as shown in FIG. 5, energy of 5000 mJ/cm$^2$ or less, for example, 4000 mJ/cm$^2$ is applied to the coated film 101 in an oxygen concentration atmosphere of 400 ppm, preferably, 50 ppm or less, for example, in a nitrogen (N$_2$) gas atmosphere. As the energy, for example, ultraviolet rays (UV) having a main wavelength of 200 nm or less, for example, the ultraviolet rays having a main wavelength of 172 nm is radiated. The main wavelength is a wavelength corresponding to the maximum peak or a periphery thereof in a spectrum.

Figure 6:
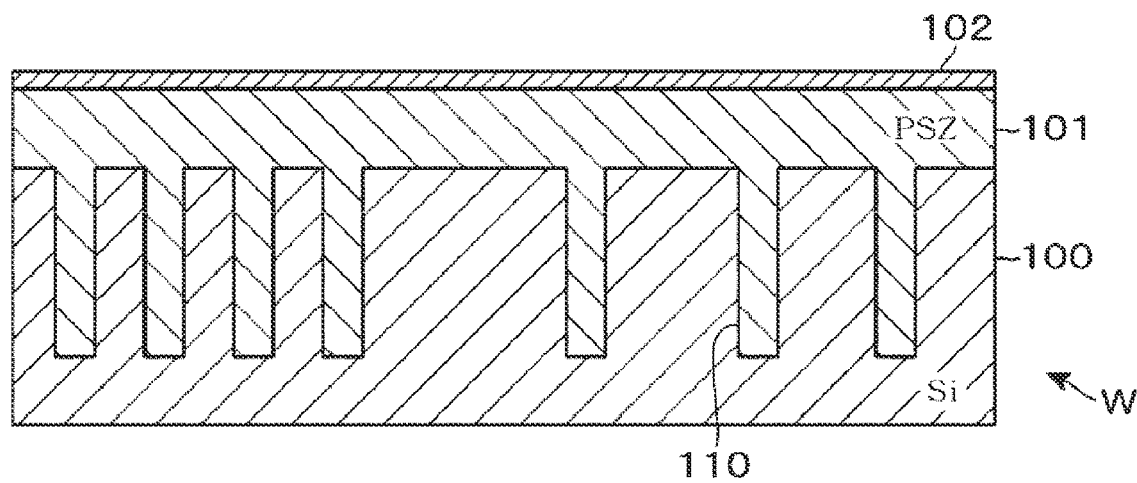
FIG. 6 is a diagram illustrating a process of forming an insulating film according to an embodiment of the present disclosure.

Next, an organic film 102 that is, for example, a protective film of polystyrene is formed on the surface of the coated film 101. Accordingly, as shown in FIG. 6, the surface of the coated film 101 is covered with the organic film 102, so that it is possible to suppress a contact between dangling bonds produced in the coated film 101 and the atmospheric atmosphere. Further, since the organic film 102 is hydrophobic, it is possible to prevent water in the atmosphere from permeating into the coated film 101.

Since the dangling bonds formed on the surface of the coated film 101 have high reactivity, they easily react with oxygen or water in the atmospheric atmosphere. If the dangling bonds are oxidized in a range of a room temperature, the reaction smoothly progresses, so an oxide film with low denseness may be formed on the surface of the coated film 101. Accordingly, by covering the surface of the coated film 101 with the organic film 102, it is possible to suppress a contact between the dangling bonds formed on the surface of the coated film 101 and the atmospheric atmosphere, and it is possible to suppress the formation of an oxide film having a low denseness on the surface of the coated film 101.

Figure 7:
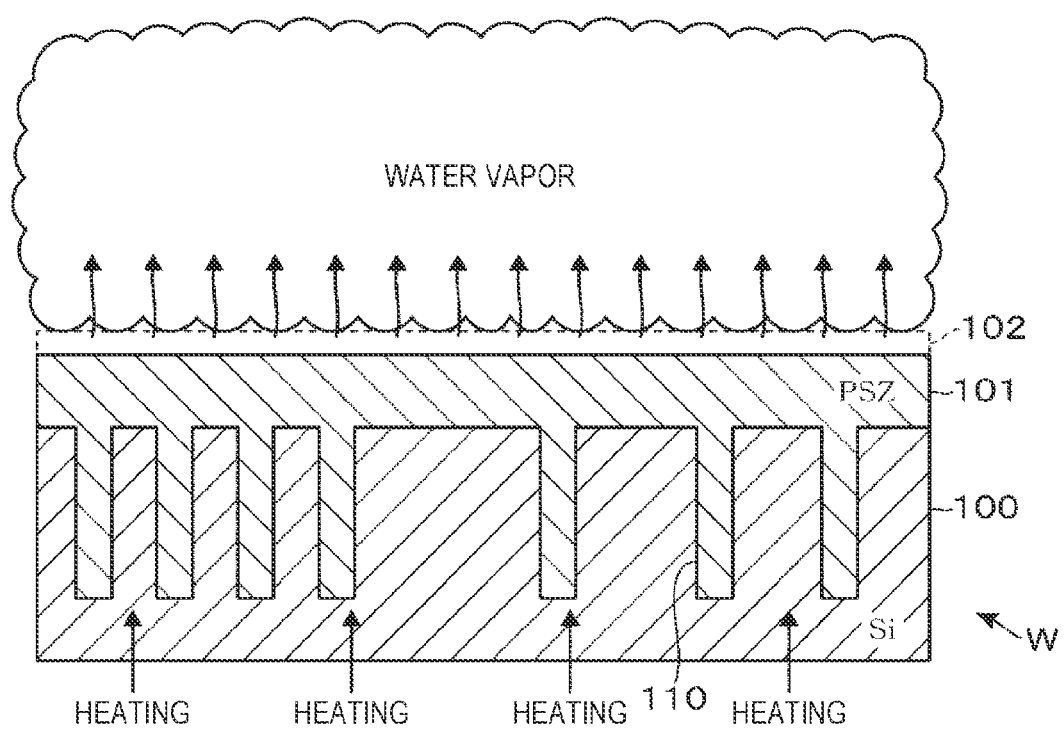
FIG. 7 is a diagram illustrating a process of forming an insulating film according to an embodiment of the present disclosure.

Further, in a next curing process, as shown in FIG. 7, heating is performed in stages at 350 to 450 degrees C. For example, under a water vapor atmosphere, heating is performed at 400 degrees C. and then performed at 450 degrees C. and heating is performed at 450 degrees C. in a $N_2$ gas atmosphere while water vapor is supplied to the wafer W. In this process, since the organic film 102 formed on the coated film 101 is polystyrene, it sublimates into water and carbon dioxide and is easily removed by heating, so the surface of the coated film 101 is exposed. The coated film 101 is heated at a temperature of 350 to 450 degrees C. in a water vapor atmosphere.

Figure 8:
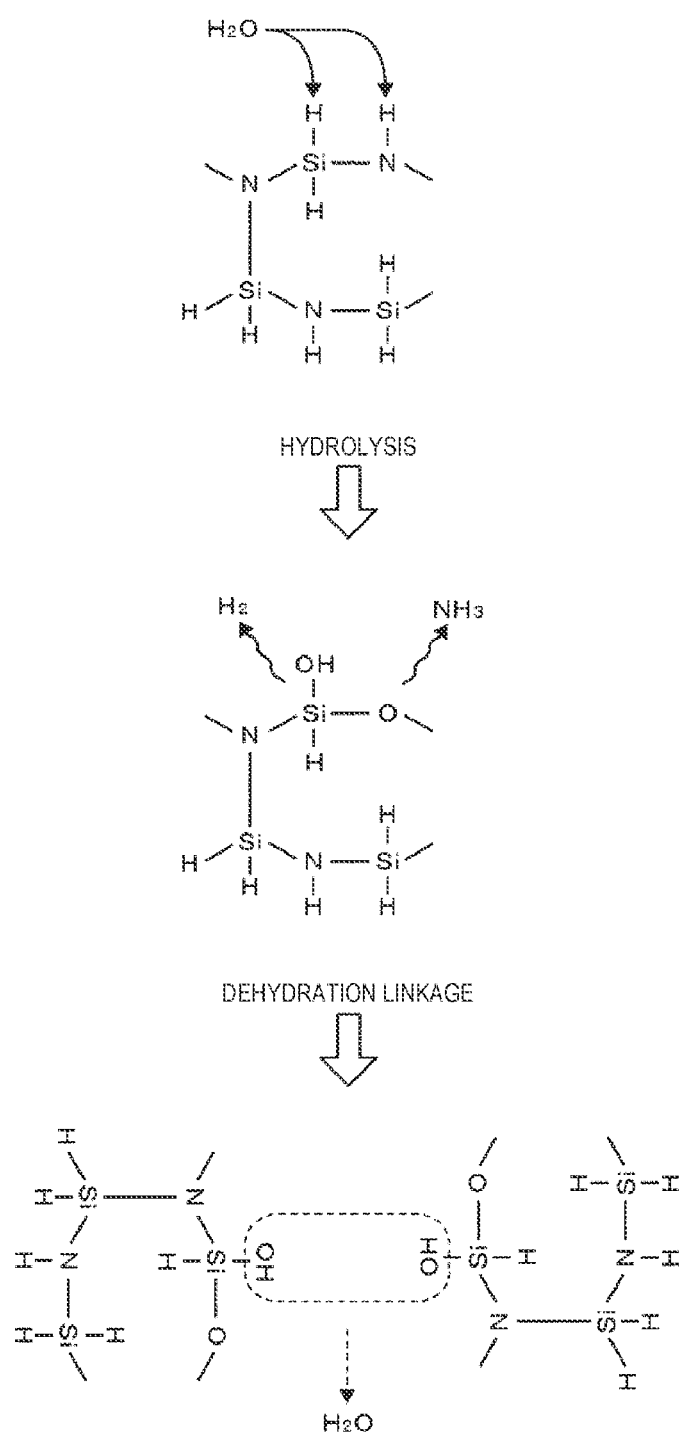
FIG. 8 is a diagram illustrating a reaction path of polysilazane in a general film-forming processing.

FIG. 8 shows a reaction path when the curing treatment was performed on polysilazane without radiating the ultraviolet rays. FIG. 9 shows a reaction path when the curing treatment was performed on polysilazane to which the ultraviolet rays have been radiated. As shown in FIG. 8, when the curing treatment is applied to polysilazane, H bonding to Si becomes an OH-group by hydrolysis, an N—H-group oxides into ammonia ($NH_3$), and Si—O bonds are produced. Further, OH-groups form crosslinks through dehydration condensation. However, as described above, since the hydrolysis is difficult to occur when the curing treatment is performed, a film having a low denseness is formed.

However, by radiating the ultraviolet rays to the coated film 101 containing polysilazane before the curing treatment, as shown in FIG. 9, in addition to Si—H bonds are cut to form dangling bonds, and some Si—N bonds are cut to form dangling bonds. Accordingly, when the curing treatment is performed, an OH-group easily bonds to the dangling bond to form Si—OH. Further, the OH-groups form crosslinks through dehydration condensation to form a Si—O—Si bond. Further, the Si—N bonds of polysilazane are substituted by O to form a silicon oxide. As described above, since dangling bonds are formed in advance and the production efficiency of OH-groups is high and a crosslinking rate is improved, an insulating film (silicon oxide film) having a good quality is formed.

Figure 10:
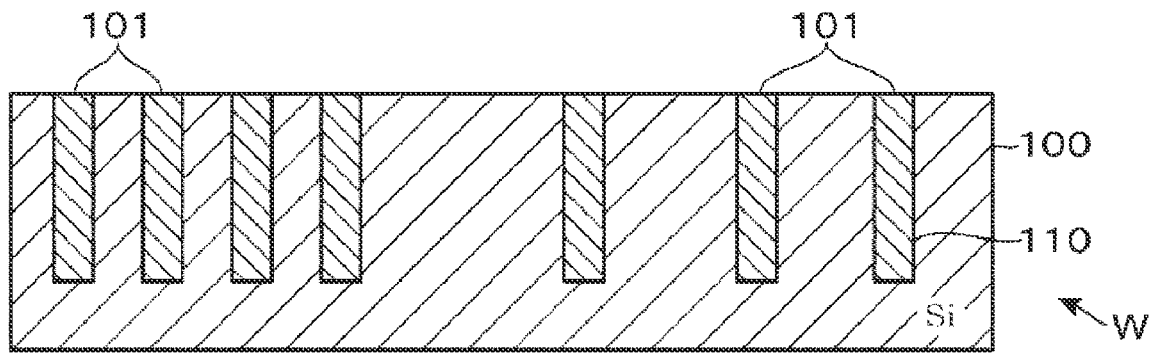
FIG. 10 is a diagram illustrating a planarization of a surface of an insulating film.

After the insulating film is hardened, as shown in FIG. 10, the remaining coated film 101 on the surface of the wafer W is removed, for example, by Chemical Mechanical Polishing (CMP). When the strength of the coated film 101 is low, it is difficult to polish the coated film 101 by CMP. However, the coated film 101 is the silicon oxide film having a high denseness, so the strength of the coated film 101 is sufficiently high. Accordingly, the coated film 101 is polished by CMP, and the silicon film 100 is exposed on the surface of the wafer W.

Figure 11:
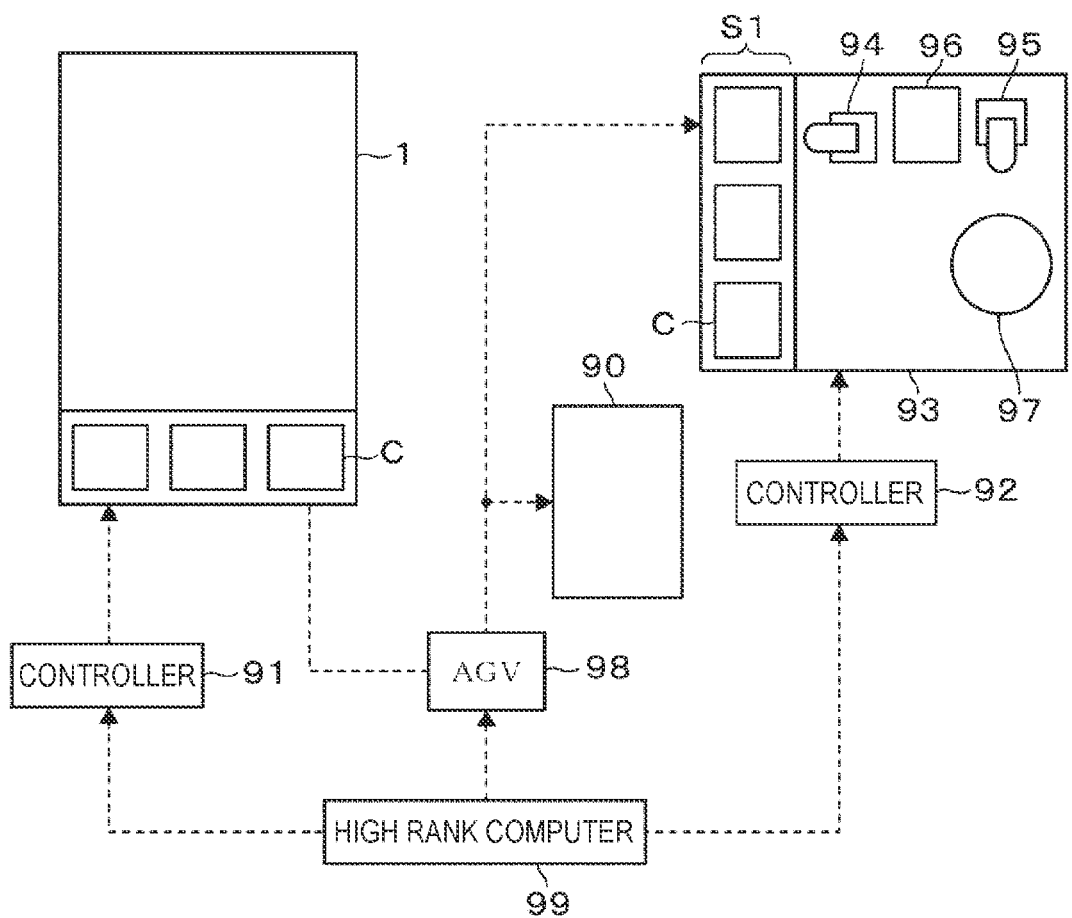
FIG. 11 is a plan view showing a system for processing a substrate according to an embodiment of the present disclosure.

Next, the system for processing a substrate that forms an insulating film is described. As shown in FIG. 11, the system for processing a substrate includes a substrate processing apparatus 1 for processing a substrate such as a coating treatment that applies an insulating film on a wafer W, and a heat treatment apparatus 93 including a heat treatment furnace that performs heat treatment on the wafer W, for example, a vertical heat treatment apparatus 97. A transfer vehicle (AVG) 98 that is a container transfer mechanism for transferring a carrier C between the substrate processing apparatus 1 and the heat treatment apparatus 93 is provided. Between the substrate processing apparatus 1 and the heat treatment apparatus 93, a loading table 90 is provided on which the wafer W accommodated in the carrier C is loaded and stands for a period before the wafer W is transferred to the heat treatment apparatus 93 after processing is finished in the substrate processing apparatus 1.

Figure 12:
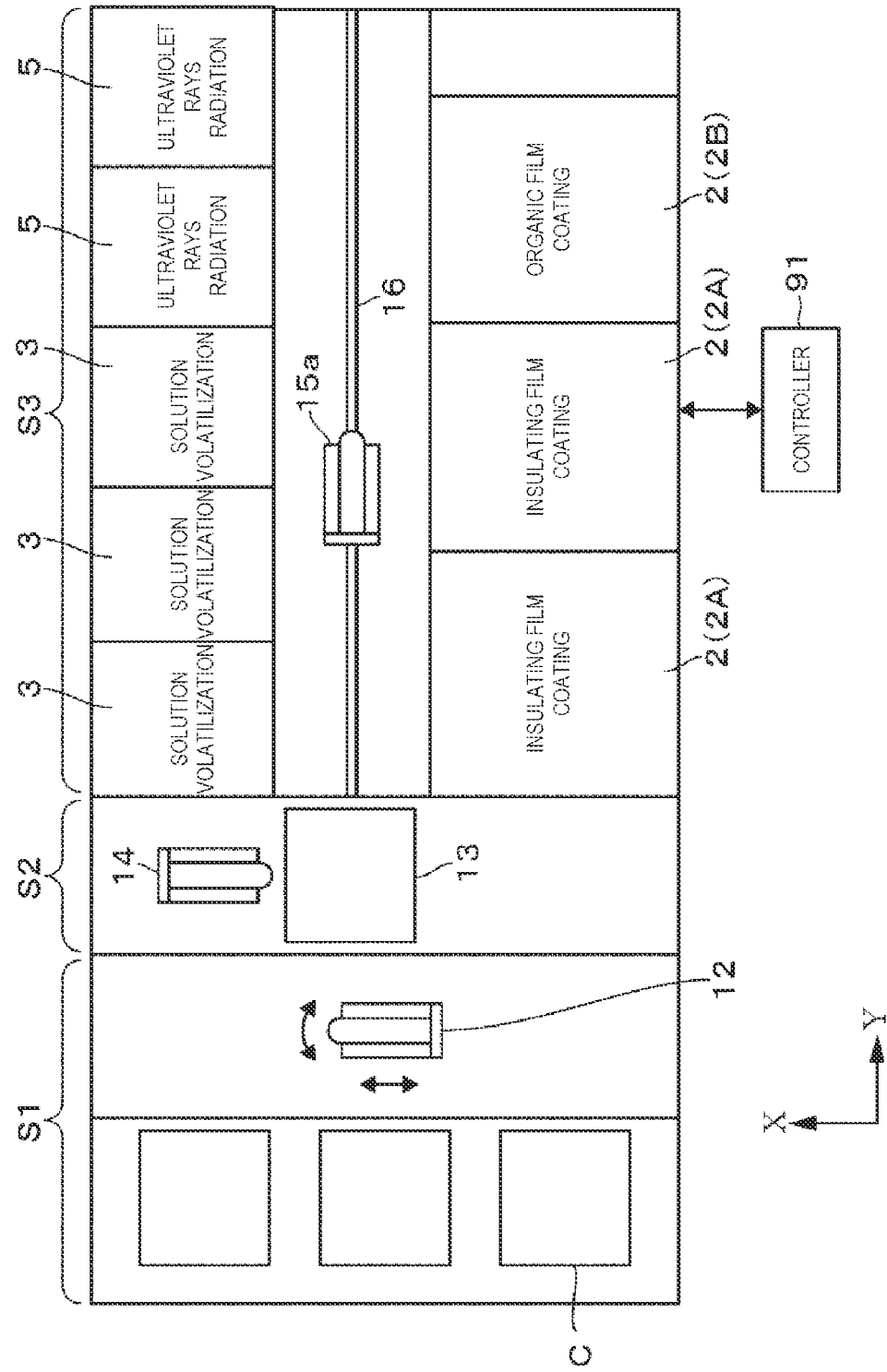
FIG. 12 is a plan view showing an apparatus for processing a substrate.
Figure 13:
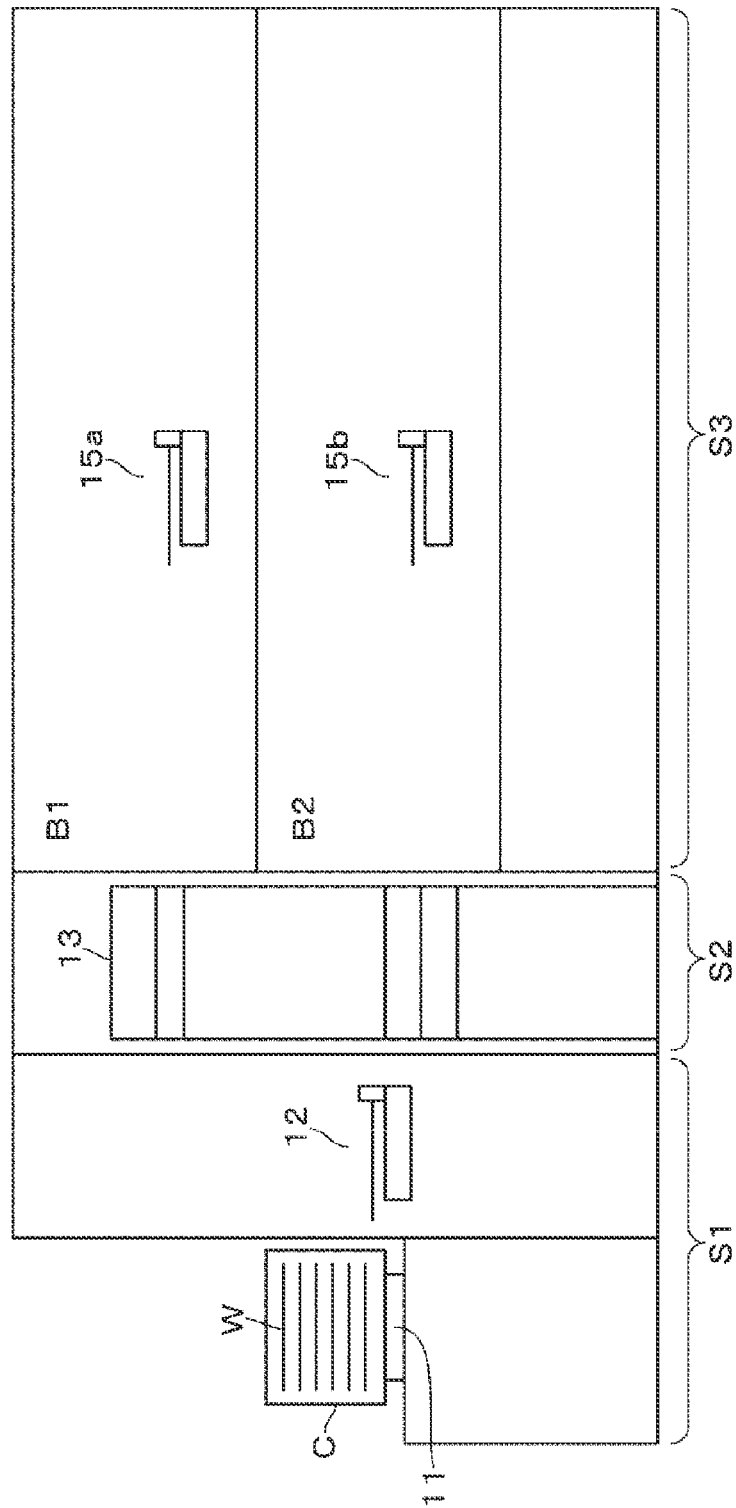
FIG. 13 is a vertical cross-sectional view of the apparatus for processing a substrate.

As shown in FIGS. 12 and 13, in the substrate processing apparatus 1, a carrier block S1, a relay block S2, and a processing block S3 are connected in a line. The carrier block S1 is a load/unload port for loading and unloading the wafers W from the carrier C, which is a transfer container accommodating a plurality of wafers W, to the apparatus.

The carrier block S1 has a stage 11 on which a plurality of (e.g., three) carriers C for accommodating and conveying a plurality of wafers W is loaded, for example, in a lateral direction (in the direction X) as shown in FIG. 12. Further, the carrier block S1 has a conveyance mechanism 12 that is a transfer arm for conveying the wafers W into the carriers C loaded on the stage 11. The conveyance mechanism 12 is configured such that a portion in which the wafers W are held and supported is capable of moving forward/backward, moving in the direction X, rotating about a vertical axis, and moving up/down.

The relay block S2 has a function of conveying the wafers W taken out of the carriers C in the carrier block S1 to the processing block S3. The relay block S2 has a conveyance shelf 13 on which a plurality of loading tables of the wafers W are vertically disposed, and a transfer mechanism 14 capable of moving up/down to transfer the wafers W between the loading tables of the conveyance shelf 13. On the conveyance shelf 13, the loading tables for the wafers W are disposed at height positions where main transfer mechanisms 15a and 15b provided in the processing block S3 can convey the wafers W and a conveyance mechanism 42 can convey the wafers W.

The processing block S3, as shown in FIG. 13, has a two-layered structure in which processing blocks B1 and B2 are stacked up and down. The processing blocks B1 and B2 have substantially similar configurations, so the processing block B1 shown in FIG. 12 is exemplified. The processing block B1 has the main conveying mechanism 15a capable of moving along a transfer path 16, which may be a guide rail extending in a front-rear direction (direction Y) when seen from the relay block S2. Modules for performing processing on wafers W are disposed at left and right sides of the transfer path 16 in the processing block B1. In the processing block B1, a coating module 2 for applying an insulating film and an organic film is disposed at the right side when seen from the carrier block S1. Further, at the left side, for example, three solution volatilization modules 3 and two ultraviolet radiation modules 5 are disposed in parallel from the relay block S2 side.

Further, a controller 91 such as a computer is disposed in the apparatus for forming an insulating film. The controller 91 has a program storage. The program storage stores programs having instructions for executing a sequence of transferring the wafers W in the apparatus or processing the wafers W in the modules. The programs are stored in a storage medium such as a flexible disc, a compact disc, a hard disk, a Magneto-Optical (MO) disc, and a memory card, and are installed in the controller 91.

Next, the coating module 2 is described. The coating module 2, for example, performs coating on the wafer W in which a pattern is formed, using well-known spin coating. The coating module 2 includes an insulating film coating module 2A that applies a coating liquid obtained by dissolving polysilazane, which is a precursor of an insulating film, in an organic solution, and an organic film coating module 2B which is a module for forming an organic film that applies an organic film on the surface of the wafer W to which the ultraviolet rays have been radiated. Among the insulating film coating module 2A and the organic film coating module 2B, the insulating film coating module 2A applies polysilazane on wafers W. Further, the organic film coating module 2B has a similar configuration except for, for example, applying polystyrene, so the insulating film coating module 2A is exemplified herein.

Figure 14:
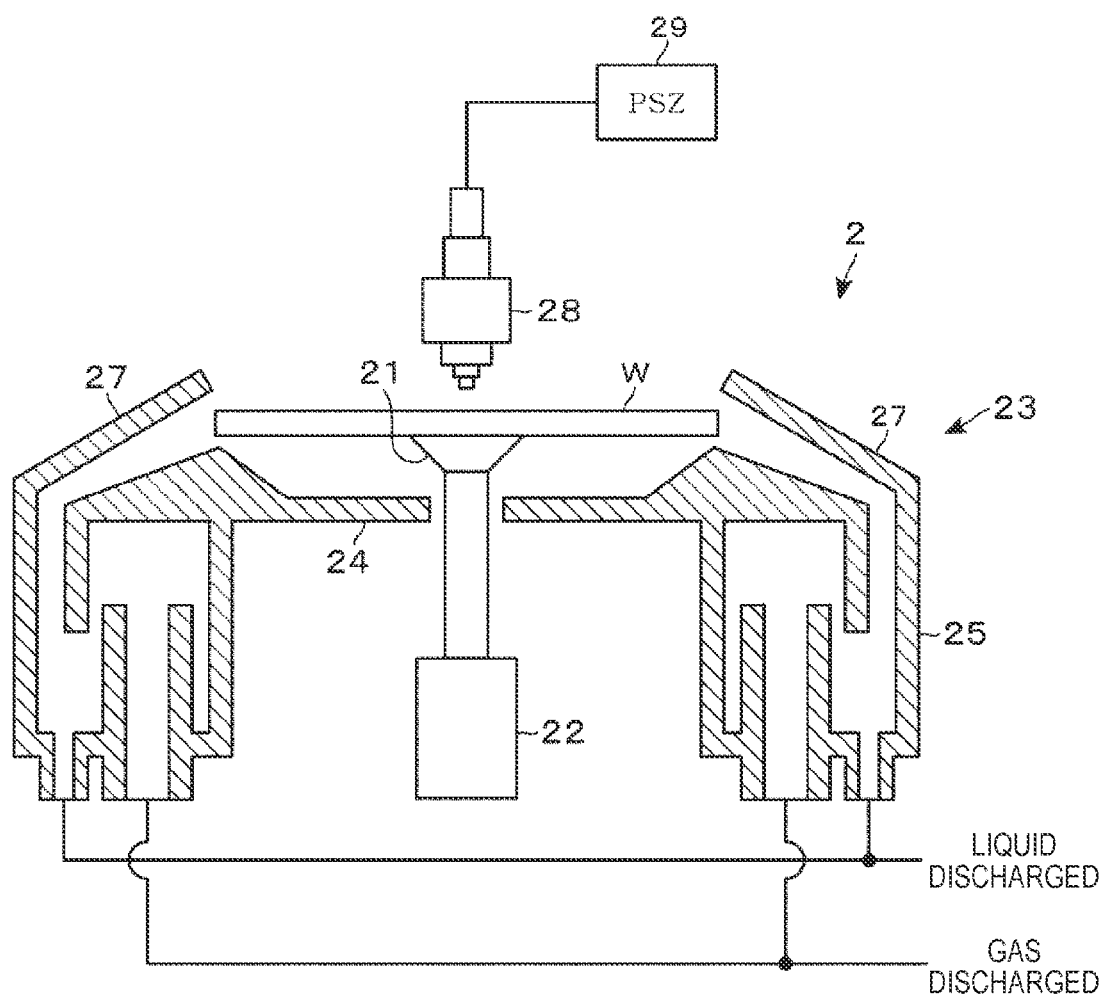
FIG. 14 is a cross-sectional view showing a coating module disposed in the apparatus for processing a substrate.

The insulating film coating module 2A, as shown in FIG. 14, has a spin chuck 21 which sucks and holds a wafer W and is capable of being rotated and moved up/down by a driving mechanism 22. Further, reference numeral 23 in FIG. 14 indicates a cup module. Reference numeral 24 in FIG. 14 indicates a guide member having a circular plate shape and having an outer circumferential wall extending downward from the circumferential edge.

A discharge space is formed between an external cup 25 and the outer circumferential wall. A lower portion of the discharge space has a structure capable of separating gas and liquid. A liquid receiving part 27 is disposed around the guide member 24 to extend toward a central portion from an upper end of the external cup 25, and receives the liquid centrifugally separated from the wafer W. The insulating film coating module 2A has a coating liquid nozzle 28. The insulating film coating module 2A forms a coated film by supplying a coating liquid to a center portion of the wafer W through the coating liquid nozzle 28 from a coating liquid supply source 29 storing a coating liquid such as polysilazane while rotating the wafer W about a vertical axis with a predetermined number of revolutions, which allows to spread the coating liquid on the surface of the wafer W. Similarly, the organic film coating module 2B forms an organic film by supplying polystyrene to the wafer W through the coating liquid nozzle 28 while rotating the wafer W about a vertical axis with a predetermined number of revolutions, which allows to spread the coating liquid on the surface of the wafer W.

Figure 15:
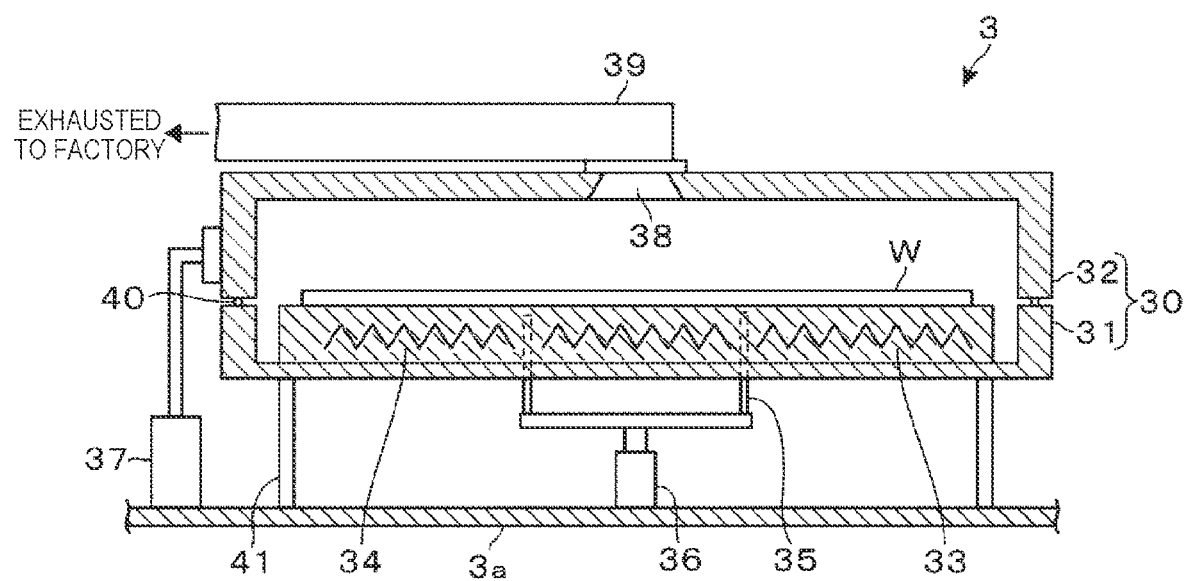
FIG. 15 is a cross-sectional view showing a solution volatilization module disposed in the apparatus for processing a substrate.

Next, the solution volatilization module 3 that volatilizes a solution which is a solvent is described. As shown in FIG. 15, the solution volatilization module 3 includes a processing container 30 composed of a lower part 31 constituted by a flat cylindrical body having an open top surface in a housing not shown, and a cover 32 disposed opposite the lower part 31. The cover 32 is configured to move up/down by an elevator 37 disposed on an upper surface of a bottom surface 3a of the housing. The processing container 30 is opened by moving up the cover 32. The lower part 31 is supported through a supporting member 41 on the bottom surface 3a of the housing. In the lower part 31, there is provided a heating plate 33 having a heater 34 buried therein for heating the wafer W mounted on the lower part 31, for example, at 100 to 250 degrees C. On the bottom surface 3a of the housing, there is provided an elevator 36 for moving up/down elevation pins 35, which penetrate through a bottom of the lower part 31 and the heating plate 33 to convey the wafer W between the processing container 30 and the main conveying mechanism 15a disposed outside the processing container 30.

The cover 32 is a flat cylindrical body having an open bottom surface. An exhaust hole 38 is formed at a center portion of the top plate of the cover 32. An exhaust pipe 39 is connected to the exhaust hole 38. When a side of the processing container 30 is defined as an upstream of the exhaust pipe 39, a downstream of the exhaust pipe 39 is connected to a common exhaust duct laid in a factory.

The cover 32 is mounted on the lower part 31 to form a processing space in which the wafer W is heated, while the cover 32 is in contact with a pin 40 disposed on an upper surface of a peripheral wall of the lower part 31 and forms a slight gap between the cover 32 and the lower part 31. When a gas is evacuated from the exhaust hole 38, an atmosphere in the housing is introduced into the processing container 30 from the gap between the cover 32 and the lower part 31. The cover 32 is configured to be capable of moving up/down between a lowered position where the processing container 30 is closed by the cover 32 and a raised position where a wafer W is conveyed to the heating plate 33.

Figure 16:
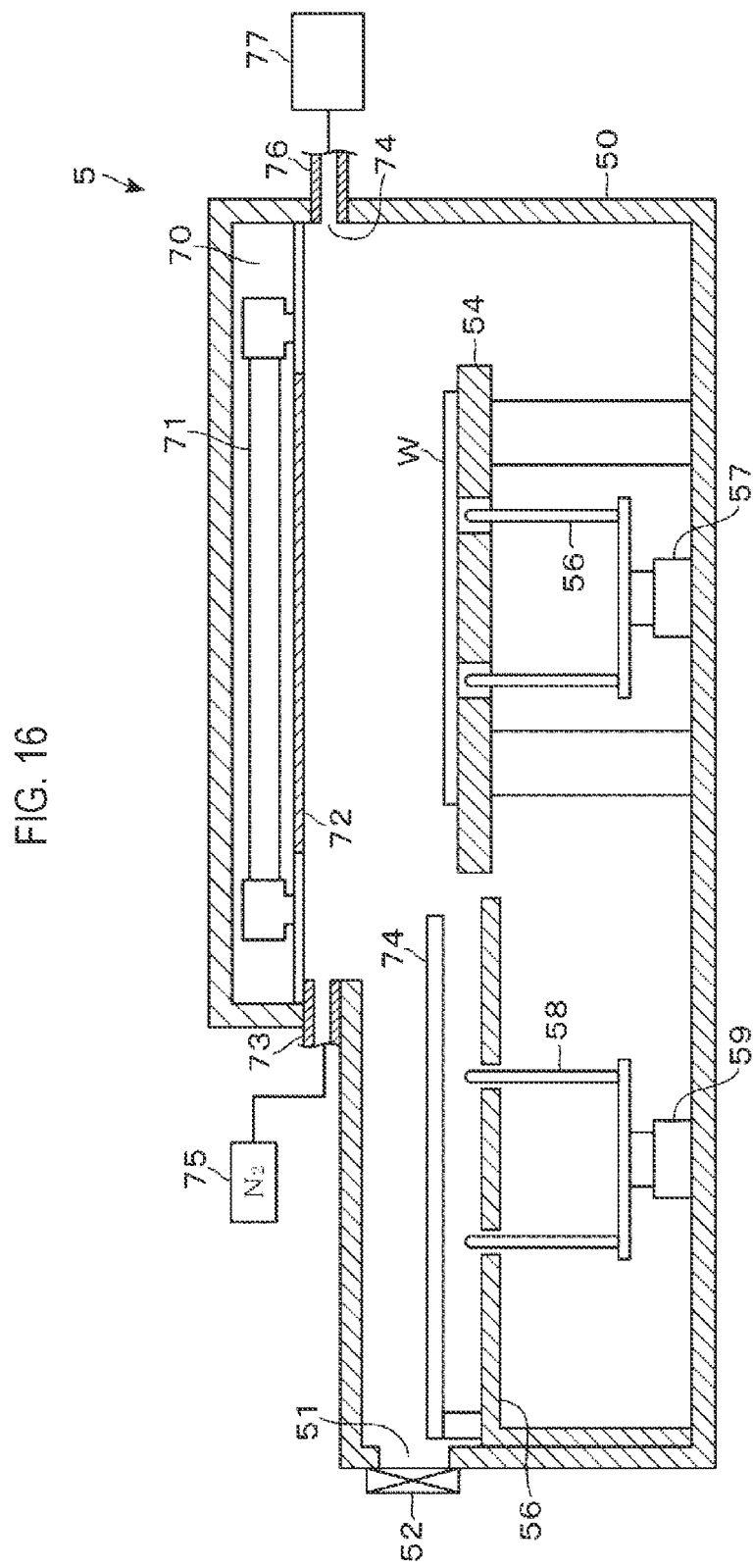
FIG. 16 is a cross-sectional view showing an ultraviolet radiation module disposed in the apparatus for processing a substrate.

As shown in FIG. 16, the ultraviolet radiation module 5, which is an energy supply module, includes a housing 50 having a rectangular parallelepiped shape that is flat and is narrow and long in a front-rear direction. A load/unload port 51 for loading/unloading the wafers W and a shutter 52 for opening/closing the load/unload port 51 are disposed on a side wall surface of the housing 50 in a front side.

A transfer arm 53 that transfers the wafer W is disposed at a front portion in the housing 50 when seen from the load/unload port 51. The transfer arm 53 is a cooling plate, and is configured to cool the wafer W to a room temperature (25 degrees C.), for example, before the ultraviolet rays are radiated after a solution volatilization process. A loading table 54 for the wafer W is disposed inside when seen from the load/unload port 51. Elevation pins 56 and 58 for conveying the wafers are disposed under the loading table 54 and the transfer arm 53, respectively. The elevation pins 56 and 58 are configured to move up/down by elevators 57 and 59, respectively.

A ramp chamber 70 accommodating an ultraviolet lamp 71 for radiating the ultraviolet rays to the wafer W loaded on the loading table 54, such as a xenon excimer lamp radiating the ultraviolet rays having a main wavelength of 172 nm, is disposed at a side. A light transmission window 72, for example, made of quartz and transmitting ultraviolet light having a wavelength of 172 nm and radiated from the ultraviolet lamp 71 to the wafer W is disposed in a bottom surface of the lamp chamber 70. Further, a gas supply part 73 and an exhaust port 74 are disposed to face each other in a side wall of a lower portion of the lamp chamber 70. A $N_2$ gas supply source 75 for supplying $N_2$ gas into the housing 50 is connected to the gas supply part 73. An exhaust mechanism 77 is connected to the exhaust port 74 through an exhaust pipe 76.

Further, when the ultraviolet rays are radiated to the wafer W loaded on the loading table 54, $N_2$ gas is supplied from the gas supply part 73 while evacuating the housing 50, so that the atmosphere around the wafer W, for example, becomes a low-oxygen atmosphere of 400 ppm or less, for example, a $N_2$ gas atmosphere. When the wafer W cooled up a room temperature is loaded on the loading table 54 by the transfer arm 53, in a state in which $N_2$ gas is supplied from the $N_2$ gas supply source 75 to form the low-oxygen atmosphere, an energy of, for example, 2000 $mJ/cm^2$ is radiated to the wafer W.

The flow of a wafer W in the apparatus for forming an insulating film is briefly described. When the carrier C accommodating the wafer W is loaded on the stage 11, the wafer W is transferred to the processing block B1 or B2 via the conveyance mechanism 12, the conveyance shelf 13, and the transfer mechanism 14. Thereafter, the coated film 101 is applied to the wafer W in the insulating film coating module 2A and then the wafer W is transferred to in order of the solution volatilization module 3, the ultraviolet radiation module 5, and the organic film coating module 2B, whereby the insulating film is formed. Thereafter, the wafer W is conveyed to the conveyance shelf 13 and then is returned to the carrier C by the transfer mechanism 14 and the conveyance mechanism 12.

Next, the heat treatment apparatus 93 is described. The heat treatment apparatus 93, as shown in FIG. 11, includes a carrier block S1 into which a carrier C is transferred, a conveyance mechanism 94 taking the wafer out of the carrier C, a loading shelf 96 on which the wafers W are loaded, and a transfer mechanism 95 transferring the wafers W loaded on the loading shelf 96 into a heat treatment furnace.

Figure 17:
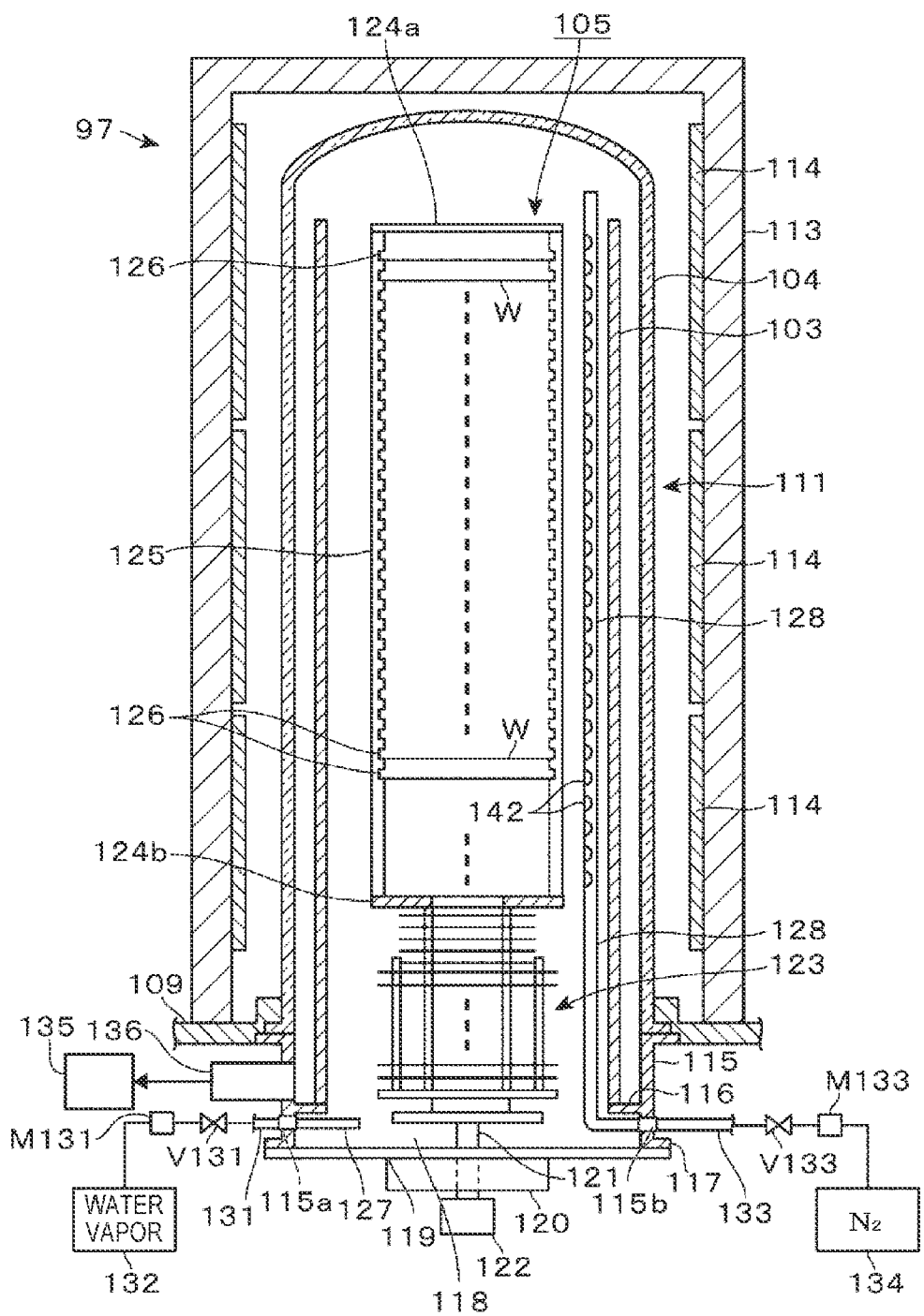
FIG. 17 is a cross-sectional view showing a vertical heat treatment apparatus disposed in a heat treatment apparatus.

For example, as shown in FIG. 17, a vertical heat treatment apparatus 97 may be used as the heat treatment furnace. The vertical heat treatment apparatus 97 includes an inner reaction tube 103 and a cylindrical outer reaction tube 104. The inner reaction tube 103 is a reaction tube having a tube shape made of quartz, having both open ends, and being supplied with a film-forming gas. The cylindrical outer reaction tube 104 is made of quartz, has a closed upper end and an open lower end, and is disposed around the inner reaction tube 103. A manifold 115 having a tubular shape is disposed under the outer reaction tube 104. The manifold 115 is made of stainless steel, and is hermetically connected to an opening of the outer reaction tube 104 to be extended from the outer reaction tube 104. A flange 117 is formed at the lower end of the manifold 115. A ring-shaped supporting portion 116 is formed inside the manifold 115. The lower end of the inner reaction tube 103 is vertically connected to an inner circumferential portions of the supporting portion 116. The inner reaction tube 103, the outer reaction tube 104, and the manifold 115 correspond to a reaction container 111.

The vertical heat treatment apparatus 97 further includes an insulator 113 covering the outer reaction tube 104 from its upper side. The lower portion of the insulator 113 is fixed to a base 109 fixing the reaction container 111. A heater 114, which is a resistance heating body, is disposed around the entire circumference inside the insulator 113.

A circular cover 119 made of quartz and opening/closing an opening 118 surrounded by the flange 117 of the manifold 115 is disposed over the opening 118. The cover 119 is installed on a boat elevator 120 that moves up/down the cover 119. A rotary table 121 is disposed on the upper surface of the cover 119, and is configured to be capable of rotating about a vertical axis by a driver 122 disposed under the boat elevator 120.

An insulating unit 123 is disposed above the rotary table 121. A wafer boat 105 that is a substrate holder is disposed over the insulating unit 123. The wafer boat 105 has a ceiling plate 124a and a bottom plate 124b. In a support 125 connecting the ceiling plate 124a and the bottom plate 124b, holding grooves 126 for holding the wafers W in a shelf shape inserted therein is formed.

A water vapor supply nozzle 127 and a $N_2$ gas supply nozzle 128 that is a purge gas supply part are disposed under the supporting portion 116 of the manifold 115. The water vapor supply nozzle 127 horizontally extends and has a front end that is open as a gas supply hole. A base end of the water vapor supply nozzle 127 is connected to a port 115a formed at the manifold 115. One end of a water vapor supply pipe 131 is connected to the port 115a from the outer circumference of the manifold 115. The other end of the water vapor supply pipe 131 is connected to a water vapor supply source 132 through a valve V131 and a flow regulator M131.

Further, the $N_2$ gas supply nozzle 128 has a horizontal portion and a vertical portion extending in an arrangement direction of the wafers W. A base end of the $N_2$ gas supply nozzle 128 is connected to a port 115b formed at the manifold 115. Further, an end of $N_2$ gas supply pipe 133 is connected to the port 115b from the outer circumference of the manifold 115. The other end of the $N_2$ gas supply pipe 133 is connected to a $N_2$ gas supply source 134 through a valve V133 and a flow regulator M133.

One end of an exhaust pipe 136 having the other end connected to a vacuum exhaust mechanism 135 is connected to a portion of the manifold 115 above the supporting portion 116 to discharge gas from a portion inside the manifold 115 above the supporting portion 116, that is, from the gap between the outer reaction tube 104 and the inner reaction tube 103.

According to the vertical heat treatment apparatus 97, for example, the wafer W, which is accommodated in the carrier C and loaded in the heat treatment apparatus, is accommodated in the wafer boat 105 while the cover 119 is moved down. Further, when the cover 119 is moved up, as shown in FIG. 17, the wafer boat 105 is stored into the reaction container 111, and the opening 118 is closed by the cover 119. Further, water vapor is supplied into the reaction container 111 from the water vapor supply nozzle 127, while the wafer W is heated to a predetermined temperature, for example, 450 degrees C. by the heater 114, whereby the curing treatment is performed on the wafer W.

Further, the heat treatment apparatus 93, as shown in FIG. 11, also includes a controller 92 for performing, for example, the transfer of the wafer W in the heat treatment apparatus 93 or the curing treatment on the wafer W in the vertical heat treatment apparatus 97. The controller 92 has a program storage. The program storage stores programs having instructions for executing a sequence of conveying the wafers W in heat treatment apparatus 93 or processing the wafers W in the vertical heat treatment apparatus 97. The programs are stored in a storage medium such as a flexible disc, a compact disc, a hard disk, a Magneto-Optical (MO) disc, and a memory card, and are installed in the controller 92. Further, the system for processing a substrate includes a higher rank computer 99 for performing the method of forming the insulating film described above by transmitting/receiving control signal to/from the controller 91 of the substrate processing apparatus 1 and the controller 92 of the heat treatment apparatus 93 and by controlling conveyance of the carrier C by the transfer vehicle 98.

Further, the wafer W in which the processing has been finished in the substrate processing apparatus 1, is stored in the carrier C and then conveyed to the loading table 90 by the transfer vehicle 98. Further, for example, until processing by the heat treatment apparatus 93 is started, the wafer W is left for a period on the loading table 90, for example, for one day. Thereafter, when the turn of processing by the heat treatment apparatus 93 is reached, the carrier C is conveyed to the carrier block S1 of the heat treatment apparatus 93 by the transfer vehicle 98, and the curing process described above is performed.

According to the embodiment described above, the coating liquid containing polysilazane is applied to a wafer W, the solution in the coated film 101 is volatilized, and then the ultraviolet rays are radiated to the coated film 101 in a nitrogen atmosphere before the curing process is performed. Accordingly, dangling bonds are easily produced at a part that is hydrolyzed in polysilazane. Since dangling bonds are produced in advance in silicon that is the part to be hydrolyzed, the production efficiency of a hydroxyl group increases. That is, since energy for hydrolysis decreases, the part remaining without being hydrolyzed decreases, even when the temperature of the curing process is 350 degrees C. As a result, dehydration condensation efficiently occurs, and a crosslinking rate is improved, so that it is possible to form a dense insulating film (having a good quality).

Further, an organic film 102 is formed on the surface of the coated film 101 before a substrate is transferred from the substrate processing apparatus 1. Accordingly, even though a wafer W accommodated in the carrier C and taken out of the substrate processing apparatus 1 is left for a period on the loading table 90, it is possible to suppress the formation of an oxide film having a low denseness caused by slow oxidation of dangling bonds. Accordingly, the coated film 101, which is formed on the wafer W after the curing process, is dense and the differences in quality of films between the wafers W can be suppressed.

The organic film may be removed before the curing treatment is applied to the coated film. For example, a liquid processing apparatus that supplies rinse to the wafer W may be provided in the heat treatment apparatus 93. After dissolving and removing the organic film by performing rinsing treatment on the wafer W using the liquid processing apparatus, the wafer W may be transferred to the vertical heat treatment apparatus 97. A liquid processing apparatus that supplies rinse to the substrate processing apparatus 1 may be provided. Before transferring the wafer W to the heat treatment apparatus 93, the wafer W may be transferred from the loading table 90 to the substrate processing apparatus 1 to perform a rinsing treatment, and then the wafer W may be quickly transferred the wafer to the heat treatment apparatus 93.

After performing the curing treatment on the wafer W, an ashing treatment may be performed by heating the wafer W. The organic film 102 may be dissolved and removed by performing heating in the ashing treatment. Acryl may be used for the organic film 102. Alternatively, a resist may be used.

In the process of volatilizing a solution shown in FIG. 4, a reflow process that rearranging oligomers in the coated film 101 may be performed. For example, during forming SOG film, gaps are generated between the oligomers contained in the coated film in some cases when a coated film is formed and then a solution is removed. For these reasons, after performing the process of removing the solution, the wafer W may be heated at 200 to 300 degrees C., for example, at 250 degrees C. Accordingly, the oligomers in the coated film 101 are rearranged to fill gaps (the reflow process). Since the oligomers are rearranged by the reflow process, the gaps between the oligomers become narrow. Accordingly, a dense film is easily obtained when crosslinks of oligomers are formed by the curing treatment to be performed.

As such an apparatus, in the substrate processing apparatus 1 shown in FIG. 12, one of the solution volatilization modules 3 may be set as a heating module (reflow module) capable of heating a wafer W, for example, at 200 to 300 degrees C. for example, 250 degrees C.

Further, in the embodiment described above, the curing treatment may be performed by heating the wafer while supplying ammonia gas in the curing process. Alternatively, $N_2$ gas may be supplied in the curing treatment.

Further, the present disclosure may be applied to forming an interlayer insulating film such as a low dielectric film. When forming an interlayer insulating film, it is required to maintain a heating temperature, for example, at 400 degrees C. or less in order to suppress migration or diffusion of copper that is a wire material. Since a high-quality insulating film is obtained even if the curing temperature is low in the present disclosure, the present disclosure can be applied to forming an interlayer insulating film.

Further, for example, the present disclosure may be applied to Pre Metal Dielectric (PMD) as an example of forming an insulating film on a substrate with narrow grooves.

Second Embodiment

Next, a method of forming an insulating film according to a second embodiment of the present disclosure is described. In this embodiment, after the process of radiating the ultraviolet rays to the coated film 101 shown in FIG. 5, the ultraviolet rays are further radiated to the coated film. For example, the ultraviolet rays of a dosage of 2000 mJ/cm$^2$ are radiated when the ultraviolet rays are primarily radiated to the coated film, and then the ultraviolet rays of a dosage of 1000 mJ/cm$^2$ are radiated as a process of secondarily radiating the ultraviolet rays to the coated film.

The amount of energy that is supplied to the coated film and activity of the coated film are described. As shown in the schematic diagram of FIG. 18, when energy is radiated to a coated film, energy exceeding a predetermined tolerance E1 is given to form dangling bonds. However, when energy exceeding a tolerance E2 is further given, activity of the coated film excessively increases, whereby the activity increases such that the coated film easily reacts with oxygen or water in the atmosphere at a room temperature. Further, by performing the following curing treatment in a state in which energy exceeding the tolerance E1 is given to the entire layer of the coated film, the entire layer of the coated film becomes a dense oxide film.

Figure 18:
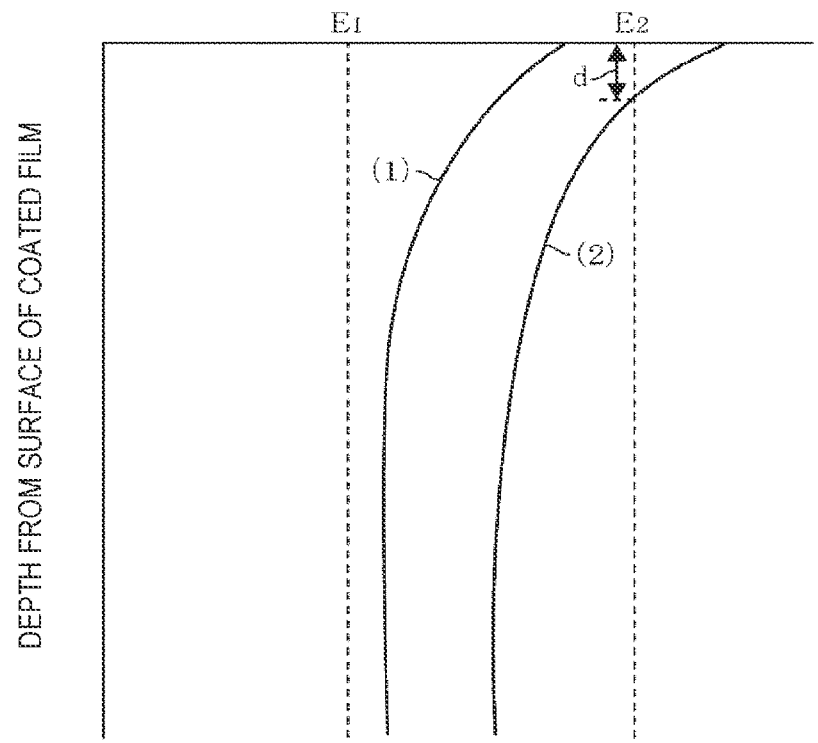
FIG. 18 is a diagram illustrating a process of forming an insulating film according to a second embodiment.

In this case, when the ultraviolet rays are radiated to the coated film, as shown in FIG. 18, activity increases on the surface of the coated film, the energy is gradually attenuated as the energy permeates from the surface of the coated film. Accordingly, by radiating the ultraviolet rays to make the entire layer of the coated film receive the energy Ea of is E1<Ea<E2, having a dosage, for example, a dosage of 2000 mJ/cm$^2$, the distribution of energy that is applied in the depth direction of the coated film, for example, becomes that shown in (1) of FIG. 18. Further, the ultraviolet rays of a dosage of 1000 mJ are radiated when the ultraviolet rays are secondarily radiated, whereby, as shown in (2) of FIG. 18, a layer receiving energy exceeding the tolerant E2 is formed in an upper layer having a very small thickness d. Further, the lower layer may be a layer that receives energy between the tolerance E1 and the tolerance E2. In this case, since the tolerance E1 is exceeded in the entire layer of the coated film, dangling bonds are formed in the layer, and in the region with the thickness d of the surface layer, activity has increased such that the coated film easily reacts with oxygen or water of the atmosphere at a room temperature.

Figure 19:
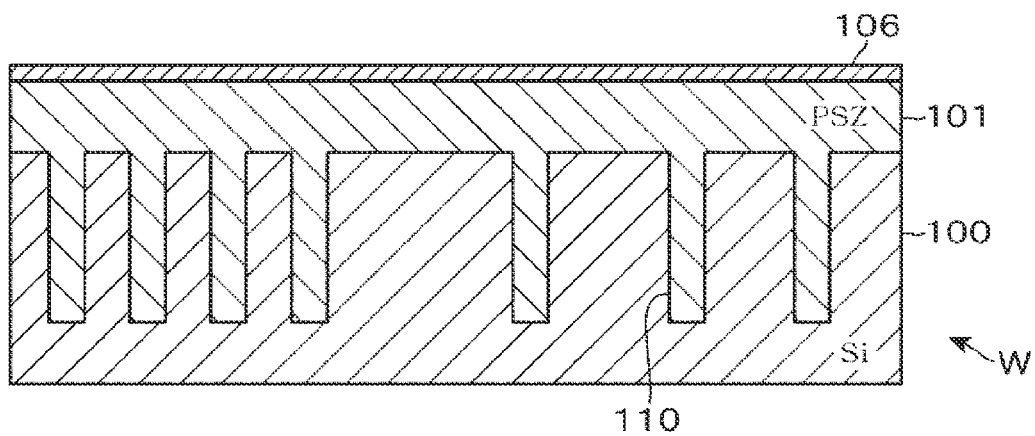
FIG. 19 is a cross-sectional view of a wafer according to the second embodiment.

Further, when the wafer W is exposed to the atmosphere, as shown in FIG. 19, rapid oxidation occurs due to oxygen or water in the atmosphere in the layer to which energy exceeding the tolerance E2 of the surface has been supplied. Since oxidation reaction rapidly progresses, an oxide film 106 having very high denseness is formed even though it is oxidation in the atmospheric atmosphere. In this case, since activity has not been increased such that oxidation rapidly occurs in the layer under the layer to which energy exceeding the tolerance E2 has been supplied, bonding of dangling bonds does not progresses, so the dangling bonds are maintained in the layer. The dense oxide film 106 corresponds to a protective film. Further, the inventors found out that when the ultraviolet rays over 3000 m/cm$^2$ were radiated to the wafer W. and the wafer W has been left for one day, an oxide film is formed on the surface layer of a coated film of the wafer W, and oxidation does not progress in the coated film. Further, it was found that the entire layer became an oxide film by the curing treatment performed later. Further, as described in a following third embodiment, since an oxide film having high resistance against etching was formed, it is estimated that a dense oxide film was formed.

When a dense film is formed on the surface of a coated film, oxygen or water in the atmosphere is difficult to permeate into the coated film. Accordingly, when the wafer W is maintained in an atmospheric atmosphere at a room temperature, the layer in which dangling bonds are formed under the dense film does not come in contact with oxygen or water in the atmosphere, so the layer is protected in a state in which the activity is maintained. Thereafter, in a curing process, since rapid oxidation progresses due to heating and a water vapor atmosphere, the water vapor passes through the dense layer on the surface layer of the coated film, thereby promoting oxidation of dangling bonds disposed under the dense layer. Water vapor permeates into the coated film, as described above, whereby a dense oxide film is formed. According to this configuration, a protective film is formed on the surface of the coated film, slow oxidation of the protective film of the coated film in an atmospheric atmosphere at a room temperature can be suppressed, so the same effect can be obtained.

Further, it may be possible to form a dense oxide film in the surface of the coated film by forming a layer to which energy exceeding the tolerance E2 has been radiated in the surface of the coated film by secondarily radiating the ultraviolet rays, and then exposing the coated film in an atmospheric atmosphere, as in the embodiment described above. Alternatively, it may be possible to forcibly form a dense oxide film by forming a layer to which energy exceeding the tolerance E2 has been radiated in the surface of the coated film and then supplying oxygen to the surface of the coated film.

Figure 20:
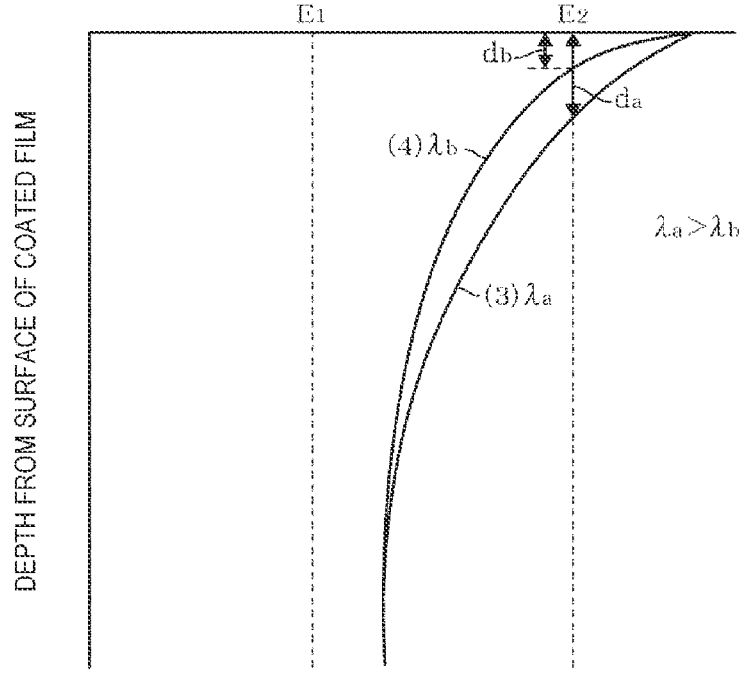
FIG. 20 is a diagram illustrating a process of forming an insulating film according to the second embodiment.

Further, the ultraviolet rays that are secondarily radiated may be the ultraviolet rays having a shorter wavelength than that of the ultraviolet rays primarily radiated. As described above, when the ultraviolet rays are radiated to a coated film, the ultraviolet rays permeate into a deep position from the surface, so the energy is gradually attenuated. In this case, the attenuation speed of energy in the depth direction of the coated film increases when the wavelength λa of the ultraviolet rays is long, as shown in the graph in (3) of FIG. 20, than that when the wavelength λb of the ultraviolet rays is short, as shown in (4) of FIG. 20 (λa>λb). Accordingly, when a layer in which the activity exceeding a tolerance E2 is formed in the surface of the coated film by radiating the same dosage of the ultraviolet rays, the thickness of the layer to which energy exceeding the tolerance E2 is radiated is da when the wavelength of the ultraviolet rays is long. On the other hand, when the wavelength of the ultraviolet rays is small, the thickness of the layer to which energy exceeding the tolerance E2 is radiated is db smaller than da. Accordingly, when the wavelength of the ultraviolet rays is small, a thinner dense oxide film is formed when oxidation occurs due to contact with the atmosphere, as compared with the wavelength is large.

A layer oxidized in the atmospheric atmosphere by applying energy over the tolerance E2 in advance becomes dense, but it is not a film generally formed by the curing treatment, so there is a possibility that the property may be different from a Si—O—Si bond formed by the curing treatment. Accordingly, it is possible to form a thin oxide film that is a protective film by making the layer to which energy exceeding the tolerance E2 is radiated thin by radiating the ultraviolet rays having a small wavelength to a coated film, so the uniformity of the quality of the film becomes good when the entire layer is oxidized by performing the curing treatment.

In the embodiment described above, the ultraviolet rays are radiated twice to the coated film. However, the illuminance of the ultraviolet rays may be increased to radiate the ultraviolet rays once as much as the sum of the dosages of the ultraviolet rays radiated twice in the embodiment, for example, of a dosage of the ultraviolet rays of a dosage of 3000 mJ/cm². Even in this case, the very thin layer in the surface of the coated film reaches a dosage of energy exceeding an allowable level, and a state in which a dosage of energy of the allowable level is reached can be formed in the coated film. Accordingly, since it is possible to form a dense film in the very thin layer in the surface layer of the coated film, the same effect can be obtained.

Further, it may be possible to form a dense film in the surface of the coated film by increasing the total time of radiating the ultraviolet rays to the coated film. By increasing the radiation time of the ultraviolet rays, the dosage of the ultraviolet rays that are radiated to the coated film can be increased, so that the same effect is obtained.

In the second embodiment, if the dosage of energy that is radiated to the coated film 101 is excessive, the denseness of the oxide film formed in the surface of the coated film 101 excessively increases. Accordingly, it is difficult for water vapor to permeate into the coated film 101 in the curing process, so the coated film 101 may be difficult to oxidize. Accordingly, it is preferable that the radiation amount of energy is 5000 J/cm² or less.

After the ultraviolet rays are radiated to the coated film, before the protective film is formed, the coated film may be exposed to a catalytic atmosphere such as ammonia gas. As an apparatus for this example, the apparatus may supply ammonia gas to the wafer W loaded on the loading table 54, for example, by further providing a gas supply part to the ultraviolet radiation module 5 shown in FIG. 16. After radiating the ultraviolet rays, for example, of a dosage of 2000 mJ/cm² to the coated film using the aforementioned ultraviolet radiation module 5 to form dangling bonds, the coated film is exposed, for example, for one minute in an ammonia gas atmosphere by supplying ammonia gas to the wafer W. Since the reactivity of the coated film has been increased by the radiated ultraviolet rays, ammonia easily permeates into the coated film. Thereafter, the surface of the coated film is further activated by radiating the ultraviolet rays of a dosage of 1000 mJ/cm², and the coated film is exposed to the atmospheric atmosphere, whereby a dense oxide layer may be formed in the surface of the coated film.

When the wafer W is conveyed into the heat treatment apparatus and the curing treatment is performed, dangling bonds become Si—O—Si bonds due to heating under a water vapor atmosphere. In this case, dehydration condensation progresses due to a catalytic effect of the ammonia permeating in the coated film, and the reaction of the dangling bonds becoming the Si—O—Si bonds is promoted. According to this configuration, since the Si—O—Si bonds can be more securely formed in the coated film, more dense oxide film can be obtained. Acid or alkali may be used as the atmosphere that is a catalyst. Further, a liquid-state catalyst such as Tetra Methyl Hydroxide (TMH) may be used. When the liquid-state catalyst is used, a stagnation of liquid may be formed on the surface of the wafer W by radiating the ultraviolet rays to the coated film to form dangling bonds and subsequently supplying TMH to the surface of the wafer W while rotating the wafer W about a vertical axis. Accordingly, a catalyst can permeate into the coated film. Further, since the activity of the surface of the coated film is increased by radiating the ultraviolet rays to the coated film and the coated film is exposed to the atmospheric atmosphere, an oxide film that is a protective film can be formed on the surface of the coated film containing the catalyst.

As the apparatus for putting the catalyst into the coated film, a catalyst addition module that makes the atmosphere for the substrate be a catalyst atmosphere in the substrate processing apparatus 1 and adds the catalyst to the coated film may be provided. Further, a plurality of ultraviolet radiation modules 5, for example, a first ultraviolet radiation module 5 and a second ultraviolet radiation module 5 may be provided. In this case, for example, after ultraviolet ray of a dosage of 2000 mJ/cm$^2$ is radiated using the first ultraviolet radiation module to a wafer W that has undergone a solution volatilization process, the wafer W is conveyed to the catalyst addition module, and a catalyst is added to the coated film. Further, the wafer W may be transferred to the second ultraviolet radiation module 5 and the ultraviolet rays of a dosage of 1000 mJ/cm$^2$ may be radiated to the coated film to increase activity of the surface of the coated film.

Figure 21:
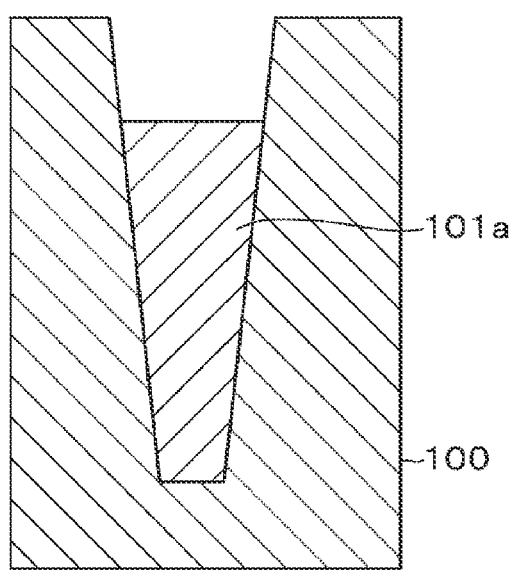
FIG. 21 is a diagram illustrating a process of forming an insulating film according to another example of an embodiment of the present disclosure.

The present disclosure may form an insulating film by applying a coating liquid several times. In this case, for example, the substrate processing apparatus 1 shown in FIGS. 12 and 13 may include a curing treatment module that can supply water vapor to a wafer W and can heat the wafer W, for example, to 450 degrees C. First, a wafer W having trenches 110 formed thereon is transferred to the insulating film coating module 2A and then a coating liquid is primarily applied. Accordingly, for example, as shown in FIG. 21, a coated film 101a having the coating liquid entered in a trench 110 formed on a silicon film 100 is formed. In FIGS. 21 to 26, the coated film formed by primarily applying the coating liquid is indicated by 101a, and the coated film formed by secondarily applying a coating liquid is indicated by 101b.

Figure 22:
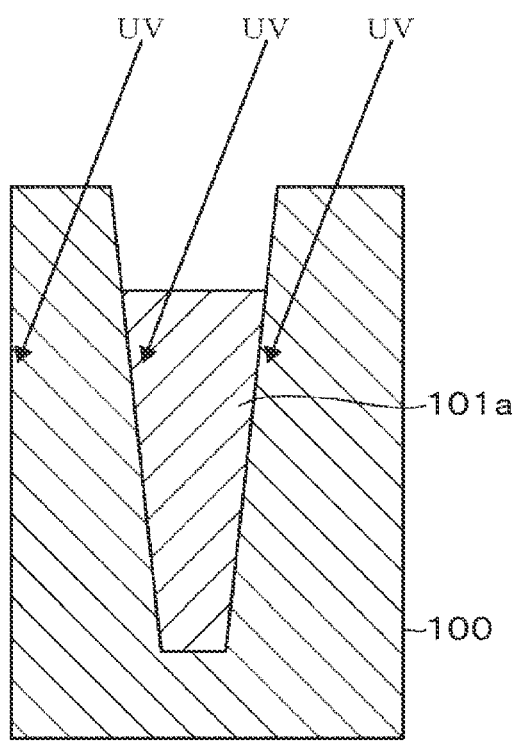
FIG. 22 is a diagram illustrating a process of forming an insulating film according to another example of an embodiment of the present disclosure.
Figure 23:
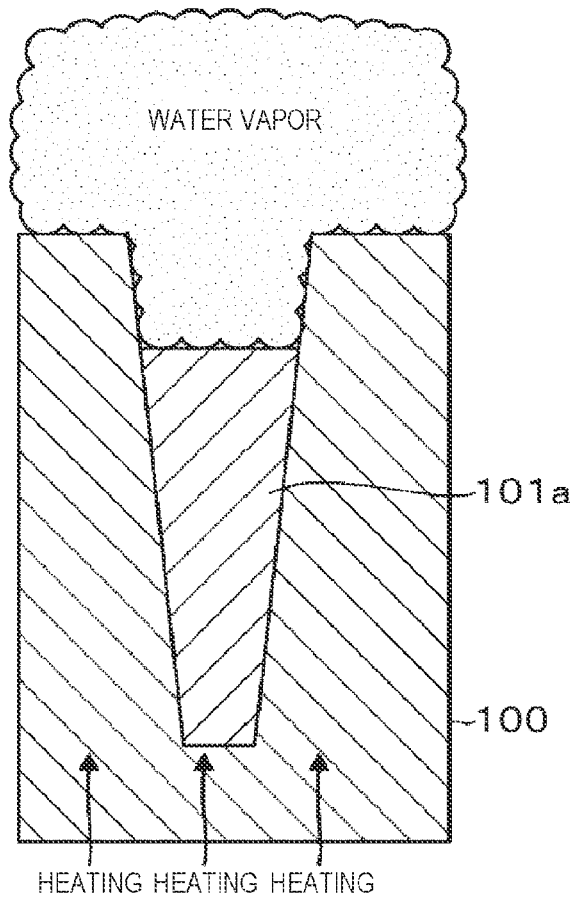
FIG. 23 is a diagram illustrating a process of forming an insulating film according to another example of an embodiment of the present disclosure.
Figure 24:
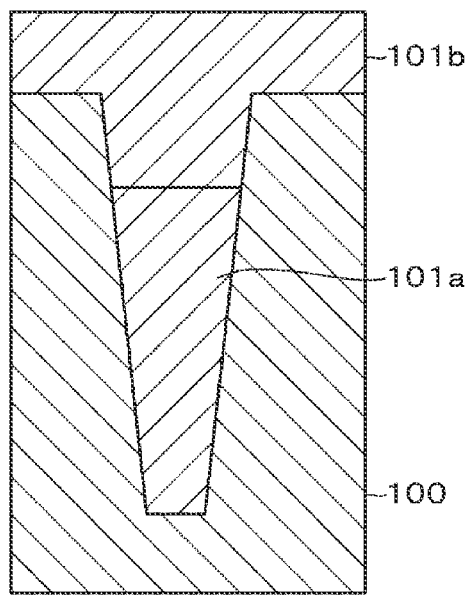
FIG. 24 is a diagram illustrating a process of forming an insulating film according to another example of an embodiment of the present disclosure.
Figure 25:
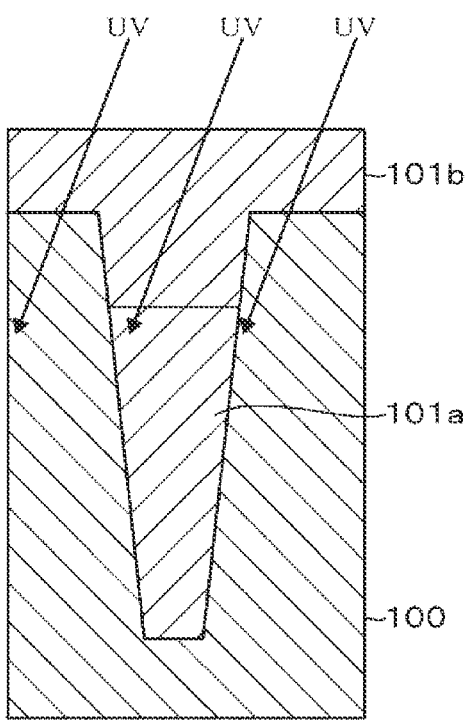
FIG. 25 is a diagram illustrating a process of forming an insulating film according to another example of an embodiment of the present disclosure.

Thereafter, similar to an embodiment, after the wafer W is transferred to the solution volatilization module 3 to volatilize the solution, for example, the wafer W is transferred to the ultraviolet radiation module 5 to radiate the ultraviolet rays of a dosage of 2000 mJ/cm$^2$ to the coated film 101a in a low-oxygen atmosphere, as shown in FIG. 22. Next, the wafer W is transferred to the curing treatment module to perform a curing process at 450 degrees C. for 120 minutes in a water vapor atmosphere, as shown in FIG. 23. Thereafter, the wafer W is transferred to the insulating film coating module 2A to perform secondary coating. Accordingly, the coated film 101b is further stacked on the wafer W, as shown in FIG. 24. Thereafter, the wafer W is transferred to the solution volatilization module 3 to volatilize the solution, and then the wafer W is transferred to the ultraviolet radiation module 5 to radiate the ultraviolet rays of a dosage of 2000 mJ/cm$^2$ to the coated film 101b in a low-oxygen atmosphere, as shown in FIG. 25. Next, the ultraviolet rays of, for example, a dosage of 1000 mJ/cm$^2$ are further radiated to the coated film 101b, thereby increasing the activity of the surface of the coated film.

Figure 26:
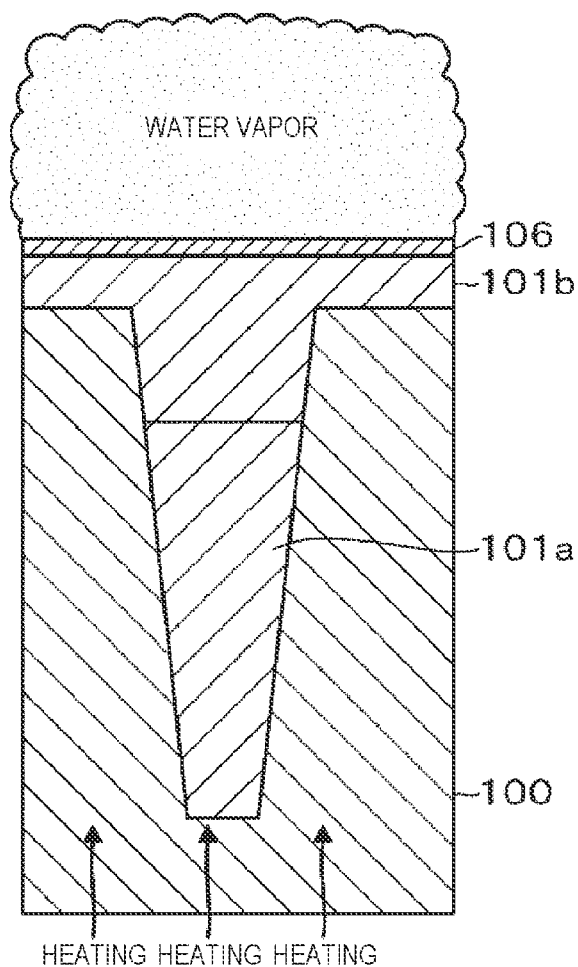
FIG. 26 is a diagram illustrating a process of forming an insulating film according to another example of an embodiment of the present disclosure.

Thereafter, the wafer W is accommodated in the carrier C and taken out of the substrate processing apparatus 1, and then left for a period on the loading table 90. Subsequently, the wafer W is transferred to the heat treatment apparatus 93. Further, as shown in FIG. 26, for example, the wafer W is heated in stages at 400 degrees C. and 450 degrees C. under a water vapor atmosphere, and then heated at 450 degrees C. in a N$_2$ gas atmosphere.

When the ultraviolet rays are radiated to the coated films 101a and 101b, since the ultraviolet rays permeate downward from the surface layers of the coated films 101a and 101b to the lower layers of the coated films 101a and 101b, the ultraviolet rays easily weaken in the lower layers in comparison to the surface layers of the coated films 101a and 101b, and there is a possibility that Si—H bonds do not sufficiently become dangling bonds. Accordingly, when the curing treatment is applied to the wafer W, the crosslinking rate may be low in the lower layers of the coated films 101a and 101b, and the crosslinking rate of the entire film may decrease. Further, for example, when the coated film in the surface layer is removed by CMP, a layer having low quality of the coated film may be exposed.

For these reasons, the coated films 101a and 101b having predetermined film thicknesses are formed by repeating, plural times, the application of the coated films 101a and 101b and the radiation of the ultraviolet rays, thereby being able to radiate the ultraviolet rays in a state in which the coated films 101a and 101b are thin. Accordingly, dangling bonds are easily formed in the entire layers of the coated films 101a and 101b. Therefore, when the curing treatment is performed, crosslinking is easily formed in the entire layers of the coated films 101a and 101b, and the crosslinking rate is high in the entire layers, such that dense coated films 101a and 101b can be formed. Further, when the wafer W is taken out of the substrate processing apparatus 1, a dense oxide film 106 that is a protective film is formed on the uppermost coated film 101b in an atmospheric atmosphere. Accordingly, the dangling bonds in the coated films 101a and 101b are protected without being oxidized when the wafer W is left for a period.

Further, after the solution is volatilized through the primary coating and the secondary coating, a reflow process that heats the wafer W, for example, at 250 degrees C. may be performed.

Further, if temperature is increased up to temperature at which crosslinking progresses in the process of radiating the ultraviolet rays, for example, if temperature is increased up to 350 to 400 degrees C. in polysilazane, formation of dangling bonds, hydrolysis, and dehydration condensation may simultaneously occur. Accordingly, isolated oligomers are locked in bonded oligomers, and the denseness of the insulating film decreases.

For these reasons, it is preferable that temperature at which the ultraviolet rays are radiated is 350 degrees C. or less. Further, when the ultraviolet rays are radiated, since it is required to set the temperature at which the crosslinking should not progress, the ultraviolet rays may be radiated in the reflow process. However, in the solution volatilization process, the solution may be deteriorated due to the radiated ultraviolet rays. Accordingly, the radiation of the ultraviolet rays needs to be performed after the solution removal process.

Further, as in Example 2 described below, it is possible to increase the effect of the method of forming an insulating film described above by maintaining the temperature for heating the wafer W at 200 to 250 degrees C. in the solution volatilization process. This is estimated as an increasing effect obtained due to reduction of energy that is absorbed in the solution by more securely removing the solution in the coated film 101, and due to an effect corresponding to rearrangement of oligomers generated by performing the reflow process even though the reflow process is not performed in Example 2.

Further, it is preferable energy has a wavelength that is absorbed in the coated film without passing through the coated film in respect of effective formation of dangling bonds. Accordingly, it is preferable that the main wavelength of the ultraviolet rays is 200 nm or less. For example, the ultraviolet rays having a wavelength of 193 nm such as an ArF lamp may be used, and a heavy hydrogen lamp may be used. Electron rays may be used as the energy that is radiated to a coated film.

Further, the apparatus, which is used in the solution volatilization process to volatilize the solution in the coated film 101, may be an apparatus that volatilizes a solution by reducing the internal pressure of an airtight processing container, for example, to a half of the atmospheric pressure to promote the volatilization of the solution in the wafer W loaded in the processing container.

EXAMPLES

The following tests were performed to examine the effect of an embodiment of the present disclosure. An insulating film was formed on a wafer W for a test using the system for processing a substrate shown in FIG. 11, and the etching strength of the insulating film was estimated.

Example 1

An example defined as Example 1-1 was conducted by radiating ultraviolet rays having a main wavelength of 172 nm in a $N_2$ gas atmosphere in the process of radiating the ultraviolet rays in the method of forming an insulating film such that the dosage becomes 2000 mJ/cm$^2$. In Example 1-1, the coating liquid described in the embodiment was applied to the wafer W, the wafer W is heated at 150 degrees C. for 3 minutes in the solution volatilization process, and then the process of radiating the ultraviolet rays was performed without performing the reflow process. Next, the wafer W was transferred to a heat treatment apparatus without being left for a period. Subsequently, in the curing process, the wafer W was heated through two stages performed at 400 degrees C. for 30 minutes and at 450 degrees C. for 120 minutes with water vapor supplied in a heat treatment furnace, and then the wafer W was heated at 450 degrees C. in a $N_2$ gas atmosphere. The target thickness of a coated film was 100 nm.

Comparative Examples 1 and 2

An example that was performed in the same way as Example 1-1 except that the ultraviolet rays of 2000 mJ/cm$^2$ were radiated in an atmospheric atmosphere in the process of radiating the ultraviolet rays was defined as Comparative Example 1. Further, an example that was performed in the same way as Example 1-1 except that the ultraviolet rays were not radiated was defined as Comparative Example 2.

In each of Example 1 and Comparative Examples 1 and 2, an etching amount per unit time (an etching rate) was estimated by performing wet etching with dilute hydrofluoric acid of 0.5%. When the etching rate of thermal oxide films of silicon with respect to the dilute hydrofluoric acid of 0.5% was defined as 1, relative etching rates in the respective examples were obtained.

The relative etching rates in Comparative Examples 1 and 2 were 3.74 and 5.55, respectively. However, the relative etching rate in Example 1 was 2.04.

According to this result, it may be considered that it is possible to increase the etching strength by radiating the energy of the ultraviolet rays to a coated film in a $N_2$ gas atmosphere before performing the curing process when forming an insulating film by applying a coating liquid containing polysilazane to a wafer W.

In addition, the amounts of atom bonds before and after the ultraviolet ray radiation treatment and after the curing treatment were estimated using a Fourier Transform Infrared spectrophotometer (FT-IR) in Example 1 and Comparative Example 1. In Comparative Example 1, Si—H bonds decreased and Si—O bond increased after the ultraviolet ray radiation treatment. Further, in Example 1, Si—H bonds decreased but Si—O bonds did not increase after the ultraviolet ray radiation treatment, and Si—O bonds increased after the curing treatment.

According to this result, it is presumed that since Si—H bonds were decreased due to the ultraviolet ray radiation treatment, dangling bonds could be formed. However, it is presumed that, if the ultraviolet ray radiation treatment is performed in an atmospheric atmosphere, crosslinking reaction progresses before the curing treatment, and if the ultraviolet ray radiation treatment is performed in a $N_2$ gas atmosphere, it is possible to suppress crosslinking reaction before the curing treatment. Further, it is presumed that the etching strength is increased by forming dangling bonds before the curing treatment and suppressing crosslinking reaction.

Further, in examples in which processing was performed in the same was as Example 1-1 except that the dosage of the ultraviolet rays was set as 3000 and 4000 mJ/cm$^2$, similarly, the results of estimating relative etching rates were 2.70 and 2.42, respectively. An insulating film having high strength could be obtained at the dosage of about 4000 mJ/cm$^2$ of the ultraviolet rays. As in Example 3 to be described below, in an example in which the dosage of the ultraviolet rays is set as 3000 and 4000 mJ/cm$^2$, it is presumed that a layer that is a dense oxide film is quickly formed in a surface, and the coated film after the curing treatment is considered as a sufficiently dense film.

Example 2

Further, an insulating film was formed on a wafer W using the system for processing a substrate shown in FIG. 11 according to the following examples, and the etching strength of the insulating film was estimated, in order to examine the effect according to the heating temperature of a wafer W in the solution volatilization process.

Example 2-1

The coating liquid described in the embodiment was applied to the wafer W, the wafer W is heated at 150 degrees C. for 3 minutes in the solution volatilization process, and then the process of radiating the ultraviolet rays was performed without performing the reflow process. In the subsequent curing process, the wafer W was heated through two stages performed at 400 degrees C. for 30 minutes and at 450 degrees C. for 120 minutes with water vapor supplied in a heat treatment furnace, and then the wafer W was heated at 450 degrees C. in a $N_2$ gas atmosphere. The target thickness of a coated film was 100 nm.

Examples 2-2 and 2-3

Examples in which processing was performed in the same way as Example 2-1 except that the heating temperature of a wafer W in the solution volatilization process was set as 200 degrees C. and 250 degrees C., respectively, were defined as Examples 2-2 and 2-3, respectively.

The relative etching rates in Examples 2-1, 2-2, and 2-3 were 3.68, 2.74, and 2.74, respectively. It may be considered that a denser and better insulting film can be obtained by increasing the heating temperature of a wafer W in the solution volatilization process.

Example 3

The following tests were performed to examine suppression of oxidation of a coated film due to forming a dense oxide film on the surface of the coated film.

Example 3-1-1

A polysilazane film was formed on the surface of a wafer W using the system for processing a substrate shown in FIG. 11, and then the wafer W was heated at 150 degrees C. for 30 minutes. Next, the ultraviolet rays having an intensity of 40 mW/cm$^2$ were radiated to the wafer in a nitrogen gas atmosphere to obtain a dosage of 1000 mJ/cm$^2$. Next, the wafer W was accommodated in a carrier C. and was left for 1 day in an atmospheric atmosphere at a room temperature (25 degrees C.). Subsequently, the wafer W was transferred to a heat treatment apparatus, and then heated at 400 degrees C. for 3 minutes and at 450 degrees C. for 120 minutes in a water vapor atmosphere as the curing treatment. This example is defined as Example 3-1-1. Further, the target thickness of a coated film was 120 nm.

Examples 3-1-2 and 3-1-3

Examples in which processing was performed in the same way as Example 3-1-1 except that the dosages of the ultraviolet rays were 2000 mJ/cm$^2$ and 3000 mJ/cm$^2$ were defined as Examples 3-1-2 and 3-1-3, respectively.

Example 3-2-1

An example in which processing was performed in the same way as Example 3-1-1 except that a wafer W was heated at 400 degrees C. for 3 minutes and at 600 degrees C. for 120 minutes in a water vapor atmosphere as the curing treatment was defined as Example 3-2-1.

Examples 3-2-2 to 3-2-4

Examples in which processing was performed in the same way as Example 3-2-1 except that the dosages of the ultraviolet rays radiated to coated films were 2000 mJ/cm$^2$, 3000 mJ/cm$^2$, and 4000 mJ/cm$^2$ were defined as Examples 3-2-2 to 3-2-4, respectively.

Comparative Examples 3-1 and 3-2

Examples in which processing was performed in the same way as Examples 3-1-1 and 3-2-1 except that the ultraviolet rays were not radiated to coated films were defined as Comparative Examples 3-1 and 3-2, respectively.

In Examples 3-1-1 to 3-2-4 Comparative Examples 3-1 and 3-2, etching rates with respect to a solution of dilute hydrofluoric acid of 0.5% were obtained, and relative etching rates to an etching rate of a silicon oxide film manufactured by thermal oxidation treatment with respect to the solution of dilute hydrofluoric acid of 0.5% were obtained.

FIG. 27 shows the result and is a characteristic diagram showing relative etching rates in Examples 3-1-1 to 3-2-4 and Comparative Examples 3-1 and 3-2. As shown in FIG. 27, the relative etching rates were 4.12 and 3.05 in Comparative Examples 3-1 and 3-2, respectively. However, in any cases of Examples 3-1-1 to 3-1-3 and Examples 3-2-1 to 3-2-4, the relative etching rates were low in accordance with an increase in dosage of the ultraviolet rays.

The relative etching rate dropped to near 1 in Example 3-2-4 in which the temperature in the curing treatment was set to 600 degrees C. The relative etching rate dropped up to about 2 even in Example 3-1-3 in which the temperature in the curing treatment was set to 450 degrees C. Accordingly, it is possible to obtain an insulating film having higher etching strength by increasing the dosage of the ultraviolet rays in the processing of radiating the ultraviolet rays to a coated film. Further, it is possible to obtain an insulating film with sufficiently high etching strength when the temperature in the curing treatment is low even though the wafer W is left for a period.

What is claimed is:

1. An apparatus for processing a substrate, comprising:
   a coating module configured to form a coated film on a substrate by applying a first coating liquid, which is obtained by dissolving a precursor for forming an insulating film containing silicon oxide in a solvent, to the substrate;
   a solvent volatilization module configured to volatilize the solvent in the coated film;
   an energy supply module configured to supply energy to the coated film in which the solvent has been volatilized, in a low-oxygen atmosphere having a concentration of oxygen lower than an atmospheric atmosphere so as to activate the precursor;
   a protective film formation module configured to supply a second coating liquid on the coated film to which the energy has been supplied by the energy supply module to form a protective film formed of the second coating liquid on the coated film;
   a substrate transfer mechanism configured to transfer the substrate between the coating module, the solvent volatilization module, the energy supply module, and the protective film formation module; and
   a controller configured to execute a process including: after the energy is supplied by the energy supply module to the coated film in which the solvent has been volatilized, supplying, by the protective film formation module, the second coating liquid on the coated film to which the energy has been supplied.

2. The apparatus of claim 1, wherein the protective film formation module is an organic film formation module configured to supply the second coating liquid so as to form an organic film formed of the second coating liquid on a surface of the coated film.

3. The apparatus of claim 1, wherein the protective film formation module is integral with the energy supply module, and
   the energy supply module forms dangling bonds at molecular groups constituting the precursor and forms a layer, which has a high activity and is a dense oxide layer, by oxidation, on a surface of the coated film.

4. The apparatus of claim 1, wherein the solvent volatilization module is a solution-heating module configured to heat the substrate.

5. The apparatus of claim 1, further comprising: a reflow-heating module configured to heat the substrate to rearrange molecular groups in the coated film in which the solvent has been volatilized.

6. The apparatus of claim 1, wherein the energy supply module is a module configured to radiate ultraviolet rays of which a main wavelength is shorter than 200 nm, to the coated film.

7. A system for processing a substrate, comprising:
an apparatus for processing a substrate which includes:
- a load/unload port configured to load/unload the substrate accommodated in a transfer container;
- a coating module configured to form a coated film on the substrate by applying a first coating liquid, which is obtained by dissolving a precursor for forming an insulating film containing silicon oxide in a solvent, to the substrate;
- a solvent volatilization module configured to volatilize the solvent in the coated film;
- an energy supply module configured to supply energy to the coated film in which the solvent has been volatilized, in a low-oxygen atmosphere having a concentration of oxygen lower than an atmospheric atmosphere so as to activate the precursor;
- a protective film formation module configured to supply a second coating liquid on the coated film to which the energy has been supplied by the energy supply module to form a protective film formed of the second coating liquid on the coated film;
- a substrate transfer mechanism configured to transfer the substrate between the coating module, the solvent volatilization module, the energy supply module, the protective film formation module, and the load/unload port; and
- a controller configured to execute a process including: after the energy is supplied by the energy supply module to the coated film in which the solvent has been volatilized, supplying, by the protective film formation module, the second coating liquid on the coated film to which the energy has been supplied;

a heat treatment apparatus configured to form the insulating film by heating the substrate processed in the apparatus for processing the substrate and crosslinking the precursor; and a container transfer mechanism configured to transfer the transfer container between the load/unload port of the apparatus for processing the substrate and the heat treatment apparatus.

\* \* \* \* \*